(12) United States Patent
Kim et al.

(10) Patent No.: US 12,389,681 B2
(45) Date of Patent: Aug. 12, 2025

(54) DISPLAY DEVICE AND METHOD OF MANUFACTURING THE SAME

(71) Applicant: Samsung Display Co., Ltd., Yongin-Si (KR)

(72) Inventors: Myeongho Kim, Hwaseong-si (KR); Jaybum Kim, Suwon-si (KR); Kyoung Seok Son, Seoul (KR); Seungjun Lee, Suwon-si (KR); Seunghun Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 595 days.

(21) Appl. No.: 17/841,904

(22) Filed: Jun. 16, 2022

(65) Prior Publication Data
US 2023/0056897 A1 Feb. 23, 2023

(30) Foreign Application Priority Data

Aug. 17, 2021 (KR) .......................... 10-2021-0108099

(51) Int. Cl.
*H10D 86/40* (2025.01)
*H10D 86/01* (2025.01)
(Continued)

(52) U.S. Cl.
CPC ......... *H10D 86/481* (2025.01); *H10D 86/021* (2025.01); *H10D 86/423* (2025.01);
(Continued)

(58) Field of Classification Search
CPC .. H10D 86/481; H10D 86/423; H10D 86/471; H10K 59/1216
See application file for complete search history.

(56) References Cited

U.S. PATENT DOCUMENTS

2016/0372497 A1 12/2016 Lee et al.
2017/0053975 A1 2/2017 Cho et al.
(Continued)

FOREIGN PATENT DOCUMENTS

KR 10-2015-0138527 A 12/2015
KR 10-2017-0023271 A 3/2017
(Continued)

*Primary Examiner* — Peter M Albrecht
(74) *Attorney, Agent, or Firm* — Innovation Counsel LLP

(57) ABSTRACT

A display device includes a first semiconductor layer, a first conductive layer disposed on the first semiconductor layer and including a first capacitor electrode at least partially overlapping the first semiconductor layer in a plan view to constitute a first transistor, a second capacitor electrode disposed on the first conductive layer and overlapping the first capacitor electrode in a plan view to constitute a first capacitor, a second semiconductor layer disposed on the second capacitor electrode and including a third capacitor electrode overlapping the second capacitor electrode in a plan view to constitute a second capacitor, a second conductive layer disposed on the second semiconductor layer and at least partially overlapping the second semiconductor layer, and a third conductive layer disposed over the second conductive layer to implement a high-resolution image by overlapping the first capacitor electrode, the second capacitor electrode, and the third capacitor electrode.

17 Claims, 28 Drawing Sheets

(51) Int. Cl.
   *H10D 86/60*   (2025.01)
   *H10K 59/121*  (2023.01)
   *G09G 3/32*    (2016.01)

(52) U.S. Cl.
   CPC ........... *H10D 86/441* (2025.01); *H10D 86/60* (2025.01); *H10K 59/1216* (2023.02); *G09G 3/32* (2013.01); *G09G 2300/0426* (2013.01); *G09G 2300/0876* (2013.01)

(56) References Cited

U.S. PATENT DOCUMENTS

| | | | |
|---|---|---|---|
| 2021/0013280 A1* | 1/2021 | Choi | H10K 59/1216 |
| 2022/0020836 A1* | 1/2022 | Gong | H10K 59/1216 |

FOREIGN PATENT DOCUMENTS

| | | |
|---|---|---|
| KR | 10-2019-0108220 A | 9/2019 |
| KR | 10-2020-0000853 A | 1/2020 |

* cited by examiner

FIG. 3

| CL4 |
|---|
| CL3 |
| CL2 |
| OATV |
| CE2 |
| CL1 |
| ATV |

FIG. 24

| CL4 |
|---|
| CL3' |
| CL2 |
| OATV |
| CE2' |
| CL1 |
| ATV |

DISPLAY DEVICE AND METHOD OF MANUFACTURING THE SAME

CROSS-REFERENCE TO RELATED APPLICATION

This application claims priority under 35 USC § 119 to Korean Patent Application No. 10-2021-0108099 filed on Aug. 17, 2021, in the Korean Intellectual Property Office (KIPO), the entire disclosure of which is incorporated herein by reference.

BACKGROUND

1. Field

The present disclosure relates to a display device and a method of manufacturing the display device. More specifically, the present disclosure relates to a display device having a high resolution and a manufacturing method thereof.

2. Description of the Related Art

A display device refers to a device that displays an image by combining light emitted from each of a plurality of pixels. The display device may include a display area in which a plurality of pixels are disposed to display an image.

In the display device, a size of the display area may be limited. In order to display a high-resolution image, the number of pixels disposed in the limited area needs to be increased. That is, an area of each pixel needs to be reduced.

SUMMARY

An object of the present disclosure is to provide a display device capable of displaying a high-resolution image.

Another object of the present disclosure is to provide a method of manufacturing a display device capable of displaying a high-resolution image.

However, objects of the present disclosure are not limited to the above-described objects, and may be variously extended without departing from the idea and scope of the present disclosure.

In order to accomplish the above objects of the present disclosure, a display device according to embodiments may include a first semiconductor layer, a first conductive layer disposed on the first semiconductor layer and including a first capacitor electrode at least partially overlapping the first semiconductor layer in a plan view to constitute a first transistor, a second capacitor electrode disposed on the first conductive layer and overlapping the first capacitor electrode in a plan view to constitute a first capacitor, a second semiconductor layer disposed on the second capacitor electrode and including a third capacitor electrode overlapping the second capacitor electrode in a plan view to constitute a second capacitor, a second conductive layer disposed on the second semiconductor layer and at least partially overlapping the second semiconductor layer; and a third conductive layer disposed on the second conductive layer.

In one embodiment, the second capacitor electrode may include a first through hole exposing a portion of an upper surface of the first capacitor electrode, and the third capacitor electrode may include a second through hole overlapping the first through hole to expose the portion of the upper surface of the first capacitor electrode.

In one embodiment, the third conductive layer may include a first bridge electrode connecting the portion of the upper surface of the first capacitor electrode exposed through the first through hole and the second through hole, and the second semiconductor layer.

In one embodiment, the third capacitor electrode may include a third through hole exposing a portion of an upper surface of the second capacitor electrode.

In one embodiment, the third conductive layer may include a second bridge electrode connecting the portion of the upper surface of the second capacitor electrode exposed through the third through hole, and the second semiconductor layer.

In one embodiment, the second semiconductor layer and the second conductive layer may constitute a second transistor, a third transistor, a fourth transistor and a fifth transistor, and the first semiconductor layer and the first conductive layer may constitute a sixth transistor, a seventh transistor, an eighth transistor, and a ninth transistor.

In one embodiment, the third conductive layer may include a first initialization voltage line connected to an input terminal of the fourth transistor, and a second initialization voltage line connected to an input terminal of the seventh transistor while being spaced apart from the first initialization voltage line.

In one embodiment, an area of the second capacitor electrode may be larger than an area of the first capacitor electrode and the second capacitor electrode completely covers the first capacitor electrode in a plan view.

In one embodiment, a size of a first overlapping area, which is an overlapping area between the first capacitor electrode and the second capacitor electrode in a plan view, may be the same as a size of a second overlapping area, which is an overlapping area between the second capacitor electrode and the third capacitor electrode, in a plan view.

In one embodiment, the second semiconductor layer may include an oxide semiconductor.

In one embodiment, the second semiconductor layer may include a first oxide semiconductor pattern and a second oxide semiconductor pattern spaced apart from the first oxide semiconductor pattern.

In one embodiment, the third capacitor electrode may be disposed between the first oxide semiconductor pattern and the second oxide semiconductor pattern in a plan view.

In order to accomplish the above objects of the present disclosure, a display device according to embodiments may include a first semiconductor layer, a first conductive layer disposed on the first semiconductor layer and including a first capacitor electrode at least partially overlapping the first semiconductor layer in a plan view to constitute a first transistor, a second capacitor electrode disposed on the first conductive layer and including an overlapping area overlapping the first capacitor electrode in a plan view to constitute a first capacitor, the second capacitor electrode including a protruding area protruding the overlapping area, a second semiconductor layer disposed on the second capacitor electrode and including a third capacitor electrode overlapping the second capacitor electrode in a plan view to constitute a second capacitor, the third capacitor electrode exposing the protruding area in a plan view, a second conductive layer disposed on the second semiconductor layer and at least partially overlapping the second semiconductor layer, and a third conductive layer disposed on the second conductive layer.

In one embodiment, the second semiconductor layer may include an oxide semiconductor.

In one embodiment, the second semiconductor layer may include a first oxide semiconductor pattern spaced apart from the third capacitor electrode in a first direction.

In one embodiment, the third conductive layer may include a first bridge electrode connected to the first oxide semiconductor pattern and the protruding area of the second capacitor electrode.

In one embodiment, the protruding area of the second capacitor electrode may protrude from the overlapping area of the second capacitor electrode in a second direction perpendicular to the first direction.

In order to accomplish the other object of the present disclosure, a method of manufacturing a display device according to embodiments may include forming a first semiconductor layer on a substrate, forming a first insulating layer covering the first semiconductor layer, forming, on the first insulating layer, a first conductive layer including a first capacitor electrode at least partially overlapping the first semiconductor layer to constitute a first transistor, forming a second insulating layer covering the first conductive layer, forming, on the second insulating layer, a second capacitor electrode overlapping the first capacitor electrode to constitute a first capacitor, forming a third insulating layer covering the second capacitor electrode, forming, on the third insulating layer, a second semiconductor layer including a third capacitor electrode overlapping the second capacitor electrode to constitute a second capacitor, forming a fourth insulating layer covering the second semiconductor layer, and forming a second conductive layer disposed on the fourth insulating layer and at least partially overlapping the second semiconductor layer.

In one embodiment, the second semiconductor layer may include an oxide semiconductor.

In one embodiment, the method of manufacturing the display device may further include implanting impurities into the second semiconductor layer by using the second conductive layer as a mask, after forming the second conductive layer.

In the above-described embodiments of the present disclosure, the first capacitor electrode, the second capacitor electrode, and the third capacitor electrode can overlap each other in a plan view by forming one electrode of the second capacitor using the third capacitor electrode included in the second semiconductor layer. Accordingly, the area of the pixels included in the display device may be relatively reduced in a plan view, and the resolution of the display device may be relatively increased.

In the above-described embodiments of the present disclosure, one electrode of the second capacitor can be formed by using the third capacitor electrode included in the second semiconductor layer, so that the display device can be manufactured in such a manner that the first capacitor electrode, the second capacitor electrode, and the third capacitor electrode can overlap each other in a plan view. Accordingly, the area of the pixels included in the display device can be relatively reduced in a plan view, and the resolution of the display device may be relatively increased.

However, effects of the present disclosure are not limited to the above-described effects, and may be variously extended without departing from the idea and scope of the present disclosure.

BRIEF DESCRIPTION OF THE DRAWINGS

FIG. 3 is a view schematically illustrating a stack structure of components included in a pixel included in the display device of FIG. 1.

FIG. 24 is a view schematically illustrating a stack structure of components included in a pixel included in the display device of FIG. 1.

DETAILED DESCRIPTION OF THE EMBODIMENTS

Figure 1:
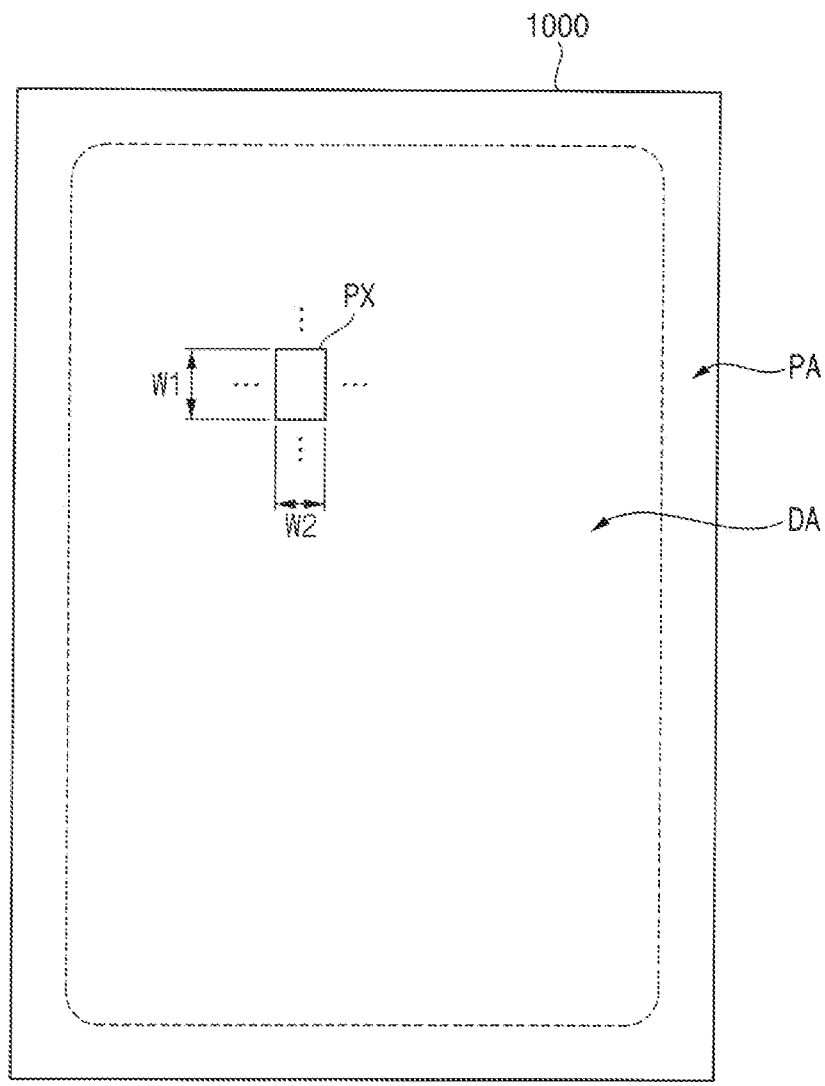
FIG. 1 is a plan view schematically illustrating a display device according to an embodiment of the present disclosure.

Hereinafter, a display device and a method of manufacturing the display device according to embodiments of the present disclosure will be described in more detail with reference to the accompanying drawings. The same or similar reference numerals are used for the same components in the accompanying drawings.

FIG. 1 is a plan view schematically illustrating a display device according to an embodiment of the present disclosure.

The display device 1000 may include a display area DA and a peripheral area PA surrounding the display area DA.

The display device 1000 may include a plurality of pixels PX disposed in the display area DA. Each of the plurality of pixels PX may emit light and the display device 1000 may display an image by combining the light emitted from each of the plurality of pixels PX. The plurality of pixels PX may be arranged in various forms in the display area DA. For example, the plurality of pixels PX may be arranged in the form of a matrix. In this case, the plurality of pixels PX may be arranged in the first direction DR1, and at the same time, in the second direction DR2 perpendicular to the first direction DR1.

Each of the plurality of pixels PX may have a first width W1 in the first direction DR1 and a second width W2 in the second direction DR2. As the first width W1 decreases, the number of pixels PX that may be arranged in the first direction DR1 in the display area DA may increase. As the second width W2 decreases, the number of pixels PX that may be arranged in the second direction DR2 in the display area DA may increase. As the number of pixels PX disposed in the display area DA increases, the resolution of an image displayed by the display device 1000 may increase.

In the peripheral area PA, the display device 1000 may include a driving circuit for driving the plurality of pixels PX. The driving circuit may generate an electrical signal. The electrical signal may be provided to each of the plurality of pixels PX, so that each of the plurality of pixels PX may emit light having a brightness corresponding to the electrical signal. Alternatively, the peripheral area PA may be omitted. For example, the display device 1000 may include only the display area DA.

Figure 2:
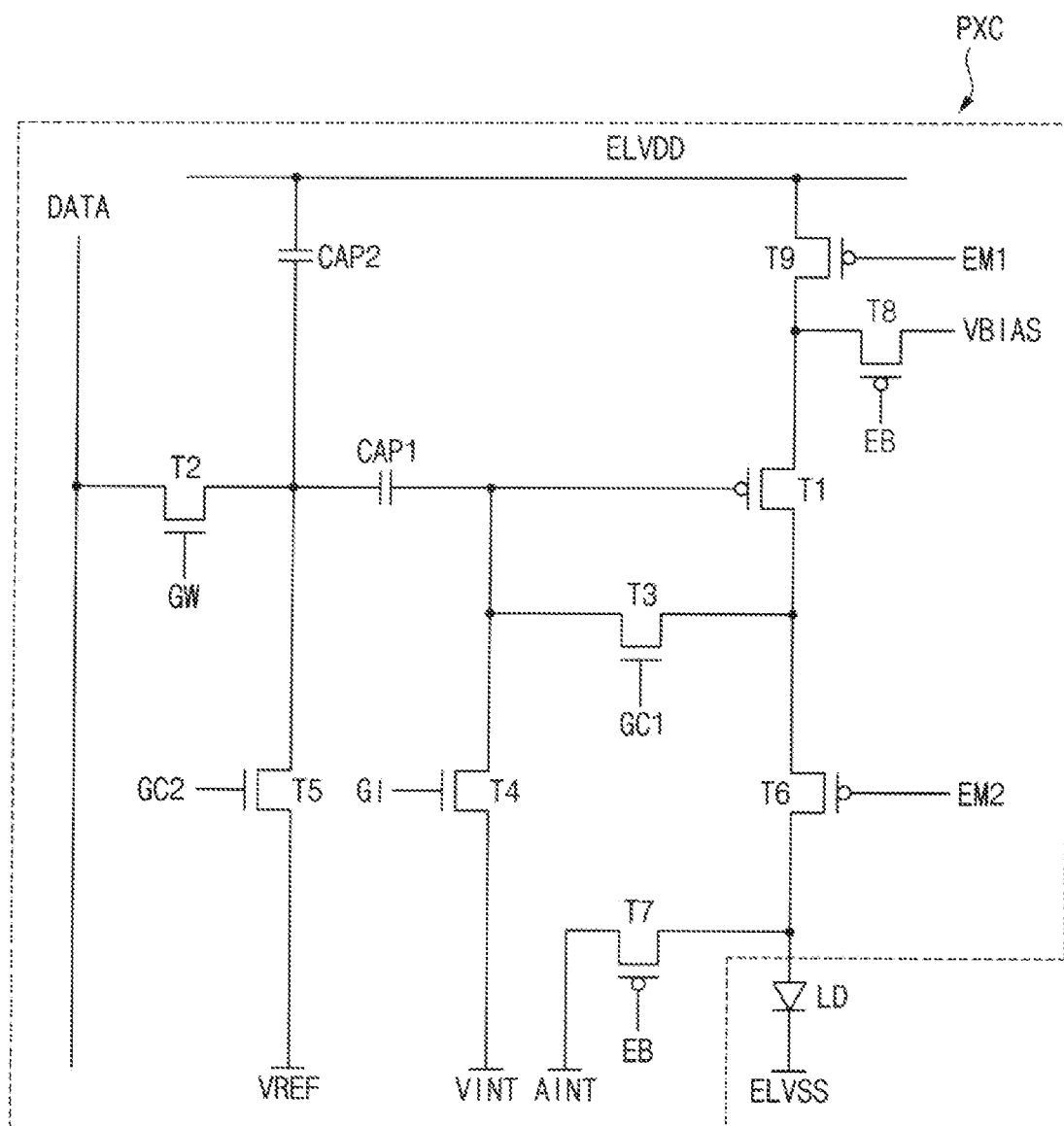
FIG. 2 is a circuit diagram illustrating a pixel circuit of a pixel included in the display device of FIG. 1.

FIG. 2 is a circuit diagram illustrating a pixel circuit of a pixel included in the display device of FIG. 1.

Referring to FIGS. 1 and 2, each of the plurality of pixels PX may include a pixel circuit PXC and a light emitting diode LD. The pixel circuit PXC may include first to ninth transistors T1, T2, T3, T4, T5, T6, T7, T8, and T9, a first capacitor CAP1, and a second capacitor CAP2.

The first transistor T1 may be electrically connected between a first power voltage line ELVDD and an anode electrode of the light emitting diode LD. A gate electrode of the first transistor T1 may be connected to a first electrode of the first capacitor CAP1. The first transistor T1 may provide a driving current corresponding to a data signal provided from a data line DATA to the light emitting diode LD. That is, the first transistor T1 may be referred to as a driving transistor.

The second transistor T2 may be connected between the data line DATA and a second electrode of the first capacitor CAP1. The second transistor T2 may provide the data signal to the second electrode of the first capacitor CAP1 and the first electrode of the second capacitor CAP2 in response to a scan signal provided from a scan line GW. That is, the second transistor T2 may be referred to as a switching transistor.

The third transistor T3 may be connected between the gate electrode of the first transistor T1 and an output terminal of the first transistor T1. The third transistor T3 may compensate for the threshold voltage of the first transistor T1 by diode-connecting the first transistor T1 in response to a first compensation control signal provided from a first compensation control line GC1. That is, the third transistor T3 may be a compensation transistor.

The fourth transistor T4 may be connected between a first initialization voltage line VINT and the first electrode of the first capacitor CAP1. The fourth transistor T4 may provide a first initialization voltage supplied from the first initialization voltage line VINT to the gate electrode of the first transistor T1 in response to the first initialization control signal provided from the first initialization control line GI. That is, the fourth transistor T4 may be a driving initialization transistor.

The fifth transistor T5 may be connected between a reference voltage line VREF and the second electrode of the first capacitor CAP1. The fifth transistor T5 may provide a reference voltage supplied from the reference voltage line VREF to the second electrode of the first capacitor CAP1 and the first electrode of the second capacitor CAP2 in response to a second compensation control signal provided from a second compensation control line GC2. That is, the fifth transistor T5 may be referred to as a reference transistor.

The sixth transistor T6 may be connected between an output terminal of the first transistor T1 and an anode electrode of the light emitting diode LD. The sixth transistor T6 may provide the driving current to the light emitting diode LD in response to a second emission control signal provided from a second emission control line EM2. That is, the sixth transistor T6 may be referred to as an emission control transistor.

The seventh transistor T7 may be connected between a second initialization voltage line AINT and the anode electrode of the light emitting diode LD. The seventh transistor T7 may provide the second initialization voltage supplied from the second initialization voltage line AINT to the anode electrode of the light emitting diode LD in response to the second initialization control signal provided from a second initialization control line EB. That is, the seventh transistor T7 may be referred to as a diode initialization transistor.

The eighth transistor T8 may be connected between a bias voltage line VBIAS and the input terminal of the first transistor T1. The eighth transistor T8 may provide a bias voltage supplied from the bias voltage line VBIAS to the input terminal of the first transistor in response to the second initialization control signal provided from the second initialization control line EB.

The ninth transistor T9 may be connected between the first power voltage line ELVDD and the input terminal of the first transistor T1. The ninth transistor T9 may provide a first power voltage supplied from the first power voltage line ELVDD to the input terminal of the first transistor T1 in response to the first emission control signal provided from a first emission control line EM1. In one embodiment, the first emission control signal and the second emission control signal may have substantially the same signal waveform and different signal timings.

In one embodiment, the second transistor T2, the third transistor T3, the fourth transistor T4, and the fifth transistor T5 may include an oxide semiconductor. In this case, each of the second transistor T2, the third transistor T3, the fourth transistor T4, and the fifth transistor T5 may be an NMOS transistor.

In one embodiment, each of the first transistor T1, the sixth transistor T6, the seventh transistor T7, the eighth transistor T8, and the ninth transistor T9 may include a silicon semiconductor. In this case, each of the first transistor T1, the sixth transistor T6, the seventh transistor T7, the eighth transistor T8, and the ninth transistor T9 may be a PMOS transistor.

The first capacitor CAP1 may be connected between a gate electrode of the first transistor T1 and an output terminal of the second transistor T2. The first capacitor CAP1 may maintain a voltage between the gate electrode of the first transistor T1 and the output terminal of the second transistor T2.

The second capacitor CAP2 may be connected between the first power voltage line ELVDD and the second electrode of the first capacitor CAP1. The second capacitor CAP2 may maintain a voltage between the first power voltage line ELVDD and the second electrode of the first capacitor CAP1.

Figure 3:
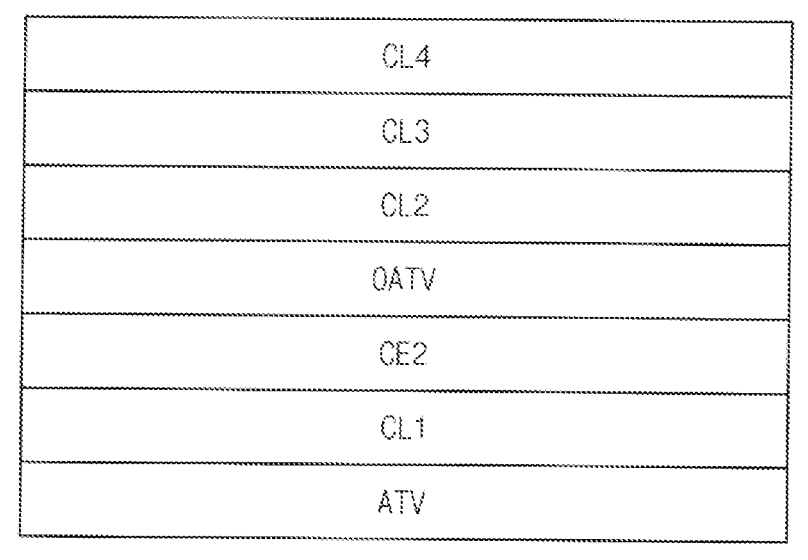

FIG. 3 is a view schematically illustrating a stack structure of components included in a pixel included in the display device of FIG. 1.

Referring to FIGS. 1 to 3, each of the plurality of pixels PX may include a first semiconductor layer ATV, a first conductive layer CL1, a second capacitor electrode CE2, and a second semiconductor layer OATV, a second conductive layer CL2, a third conductive layer CL3, and a fourth conductive layer CL4. At least one insulating layer may be disposed between layers that include the first semiconductor layer ATV, the first conductive layer CL1, the second capacitor electrode CE2, and the second semiconductor layer OATV, the second conductive layer CL2, the third conductive layer CL3, and the fourth conductive layer CL4.

The first semiconductor layer ATV may include a semiconductor material. For example, the first semiconductor layer ATV may include a silicon semiconductor.

The first conductive layer CL1 may include a conductive material. For example, the first conductive layer CL1 may include a metal material. The first conductive layer CL1 may be disposed on the first semiconductor layer ATV. At least a portion of the first conductive layer CL1 may overlap the first semiconductor layer ATV to define a transistor. For example, the first conductive layer CL1 and the first semiconductor layer ATV may constitute the first transistor T1, the sixth transistor T6, the seventh transistor T7, the eighth transistor T8, and the ninth transistor T9.

The second capacitor electrode CE2 may include a conductive material. For example, the second capacitor electrode CE2 may include a metal material. The second capacitor electrode CE2 may be disposed on the first conductive layer CL1.

The second semiconductor layer OATV may include a semiconductor material. For example, the second semiconductor layer OATV may include an oxide semiconductor.

The second conductive layer CL2 may include a conductive material. For example, the second conductive layer CL2 may include a metal material. The second conductive layer CL2 may be disposed on the second semiconductor layer OATV. At least a portion of the second conductive layer CL2 may overlap the second semiconductor layer OATV to define a transistor. For example, the second conductive layer CL2 and the second semiconductor layer OATV may constitute the second transistor T2, the third transistor T3, the fourth transistor T4, and the fifth transistor T5.

The third conductive layer CL3 may include a conductive material. For example, the third conductive layer CL3 may include a metal material. The third conductive layer CL3 may be disposed on the second conductive layer CL2.

The fourth conductive layer CL4 may include a conductive material. For example, the fourth conductive layer CL4 may include a metal material. The fourth conductive layer CL4 may be disposed on the third conductive layer CL3.

Hereinafter, a pixel and a method of manufacturing the same according to an embodiment of the present disclosure will be described with reference to FIGS. 1 to 23.

Figure 4:
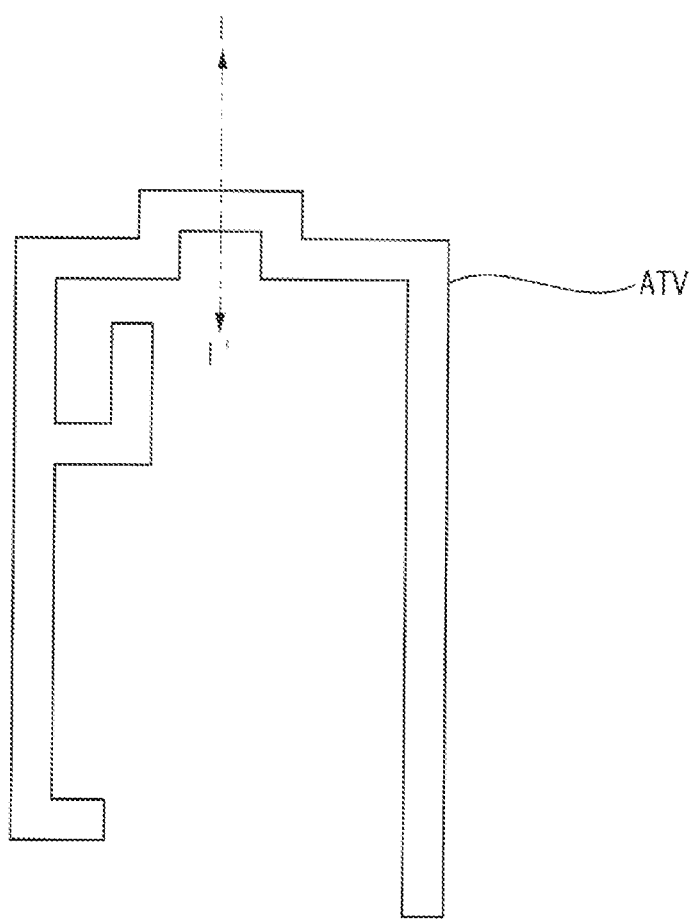
FIGS. 4, 5, 6, 7, 8, 9, 10, 11, 12, 13, 14, 15, 16, 17, 18, 19, 20, 21, 22 and 23 are views for explaining a pixel and a method of manufacturing the same according to an embodiment of the present disclosure.
Figure 4:
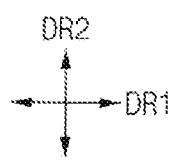
Figure 5:
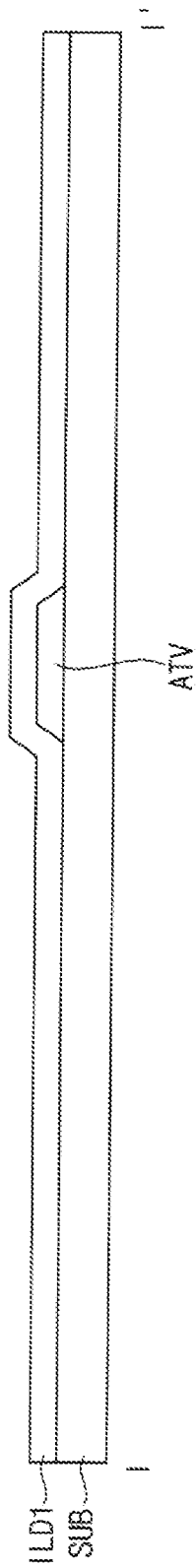

FIG. 4 is a plan view illustrating the first semiconductor layer ATV, and FIG. 5 is a sectional view taken along line I-I' of FIG. 4.

Referring to FIGS. 2, 3, 4 and 5, after forming the first semiconductor layer ATV on the substrate SUB, a first insulating layer ILD1 covering the first semiconductor layer ATV may be formed on the substrate SUB.

The first semiconductor layer ATV may be formed by forming a silicon semiconductor material onto the entire surface of the substrate SUB to form a semiconductor layer, and then patterning the semiconductor layer. The first insulating layer ILD1 may include an inorganic insulating material. For example, the first insulating layer ILD1 may include silicon oxide.

Figure 6:
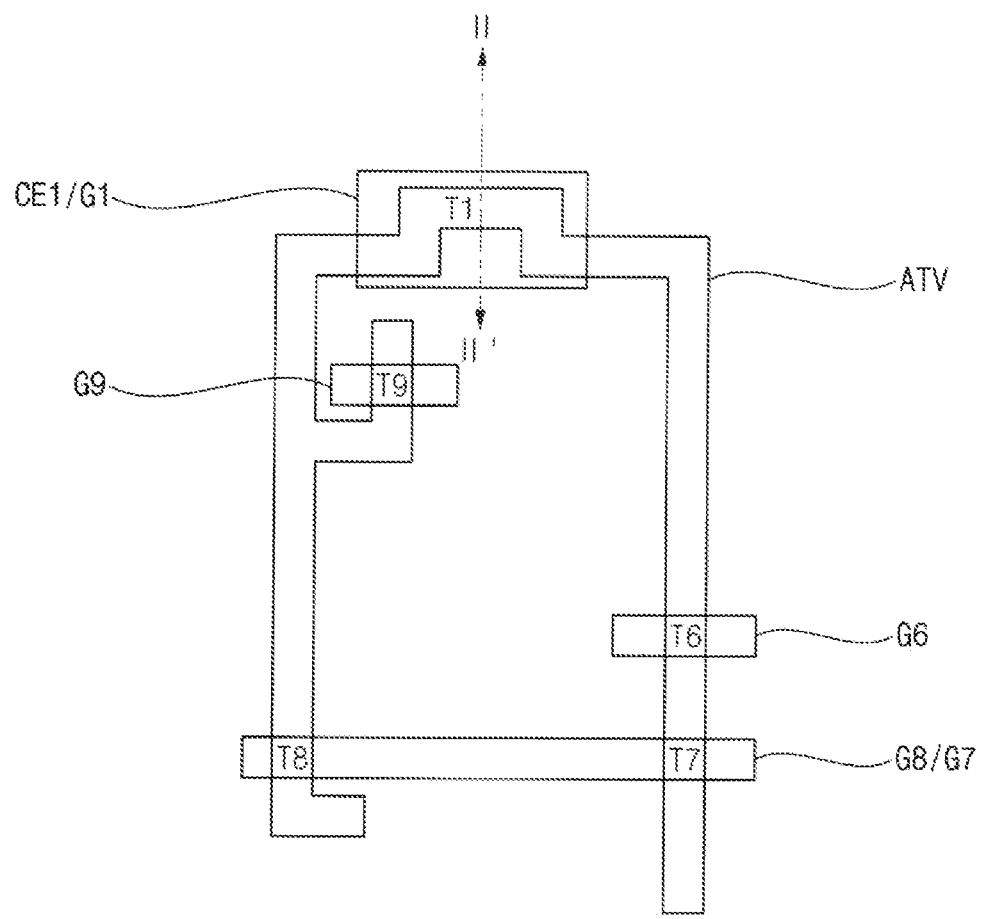
Figure 7:
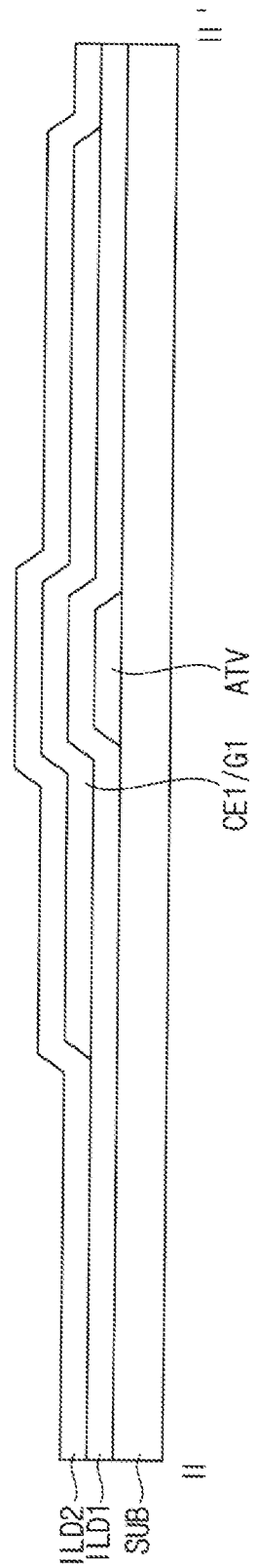

FIG. 6 is a plan view illustrating the first semiconductor layer ATV and the first conductive layer CL1, and FIG. 7 is a sectional view taken along the line II-II' of FIG. 6.

Referring to FIGS. 2, 3, 6, and 7, after forming the first conductive layer CL1 on the first insulating layer ILD1, the second insulating layer ILD2 covering the first conductive layer CL1 may be formed on the first insulating layer ILD1.

The first conductive layer CL1 may be formed by forming a conductive material onto the entire surface of the first insulating layer ILD1 to form a conductive layer, and then patterning the conductive layer. For example, the conductive layer may be patterned to form a first capacitor electrode CE1/G1, a sixth gate electrode G6, seventh and eighth gate electrodes G8/G7, and a ninth gate electrode G9.

The first capacitor electrode CE1/G1 may be a first electrode of the first capacitor CAP1. At the same time, at least a portion of the first capacitor electrode CE1/G1 may overlap the first semiconductor layer ATV to define the first transistor T1. In this case, the first capacitor electrode CE1/G1 may be a gate electrode of the first transistor T1.

At least a portion of each of the sixth gate electrode G6, the seventh gate electrode G7, the eighth gate electrodes G8, and the ninth gate electrode G9 may overlap the first semiconductor layer ATV to define the sixth transistor T6, the seventh transistor T7, the eighth transistor T8, and the ninth transistor T9.

The second insulating layer ILD2 may include an inorganic insulating material. For example, the second insulating layer ILD2 may include silicon oxide.

Figure 8:
Figure 8:
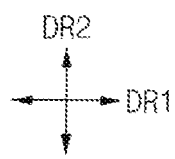
Figure 9:
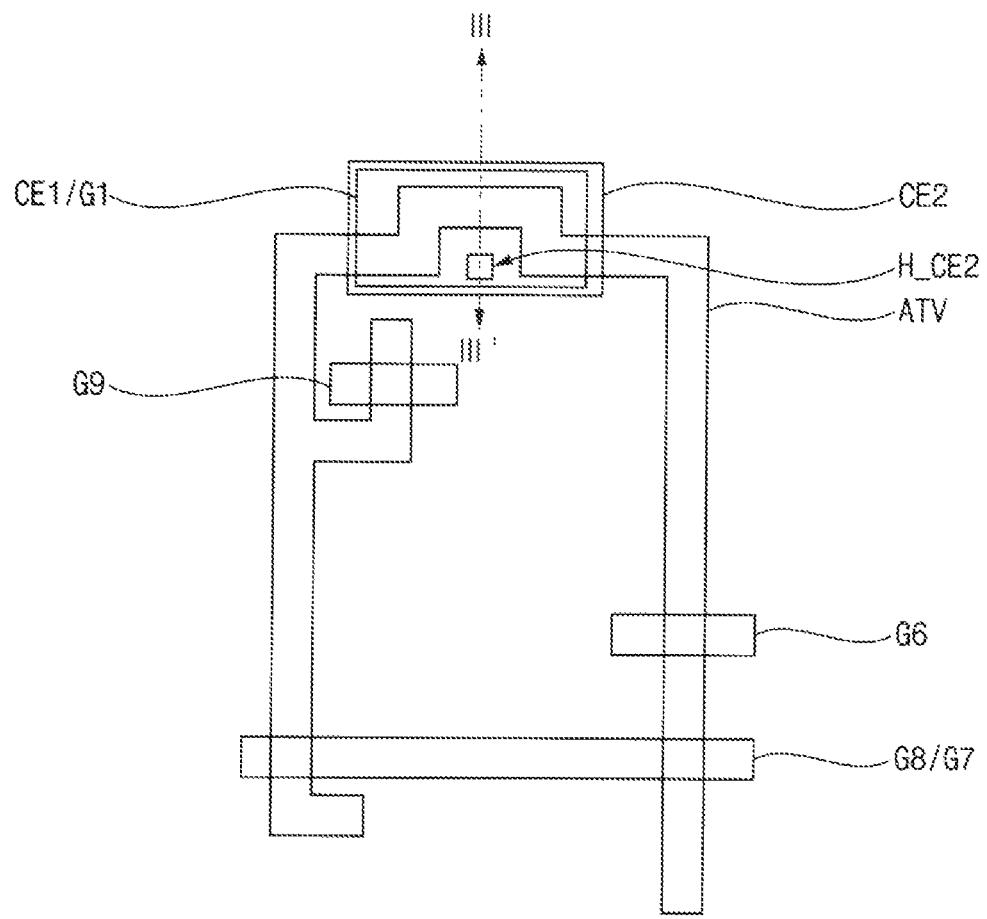
Figure 10:
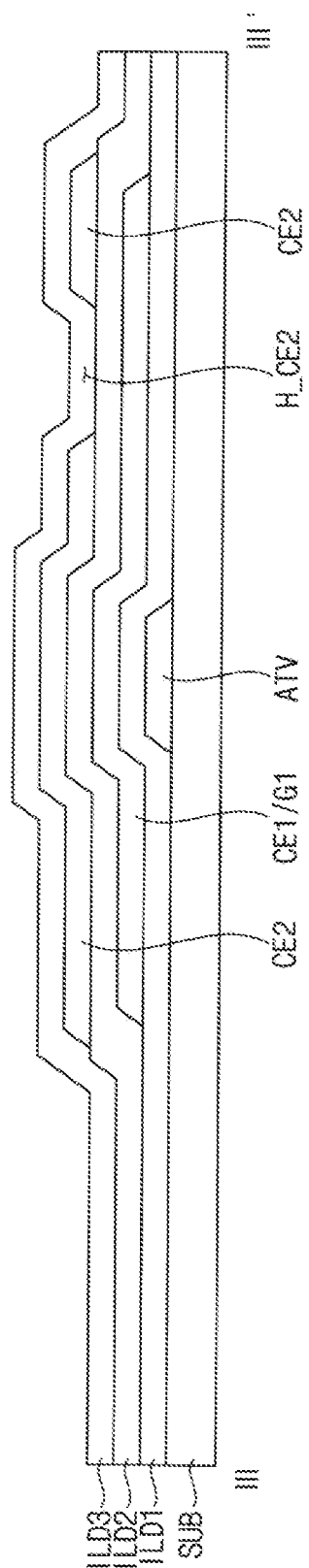

FIG. 8 is a plan view illustrating the second capacitor electrode CE2, FIG. 9 is a plan view illustrating the first semiconductor layer ATV, the first conductive layer CL1, and the second capacitor electrode CE2, and FIG. 10 is a sectional view taken along line of FIG. 9.

Referring to FIG. 8, the second capacitor electrode CE2 may include a first through hole H_CE2. The first through hole H_CE2 may be formed through the second capacitor electrode CE2.

Referring to FIGS. 2, 3, 9, and 10, after forming the second capacitor electrode CE2 on the second insulating layer IDL2, third insulating layer ILD3 covering the second capacitor electrode CE2 may be formed on the second insulating layer ILD2.

The second capacitor electrode CE2 may be formed by forming a conductive material onto the entire surface of the second insulating layer ILD2 to form a conductive layer, and then patterning the conductive layer. The second capacitor electrode CE2 may overlap the first capacitor electrode CE1/G1 to define the first capacitor CAP1. In this case, the first capacitor electrode CE1/G1 may be referred to as a first electrode of the first capacitor CAP1 and the second capacitor electrode CE2 may be referred to as a second electrode of the first capacitor CAP1. The second capacitor electrode CE2 may be completely overlap the first capacitor electrode CE1/G1 in a plan view. That is, an area of the second capacitor electrode CE2 is larger than an area of the first capacitor electrode CE1/G1 to completely cover the first capacitor electrode CE1/G1 in a plan view.

The first through hole H_CE2 may overlap a portion of the first capacitor electrode CE1/G1. In other words, in a plan view, a portion of an upper surface of the first capacitor electrodes CE1/G1 may be exposed through the first through-hole H_CE2.

The third insulating layer ILD3 may include an inorganic insulating material. For example, the third insulating layer ILD3 may include silicon oxide.

Figure 11:
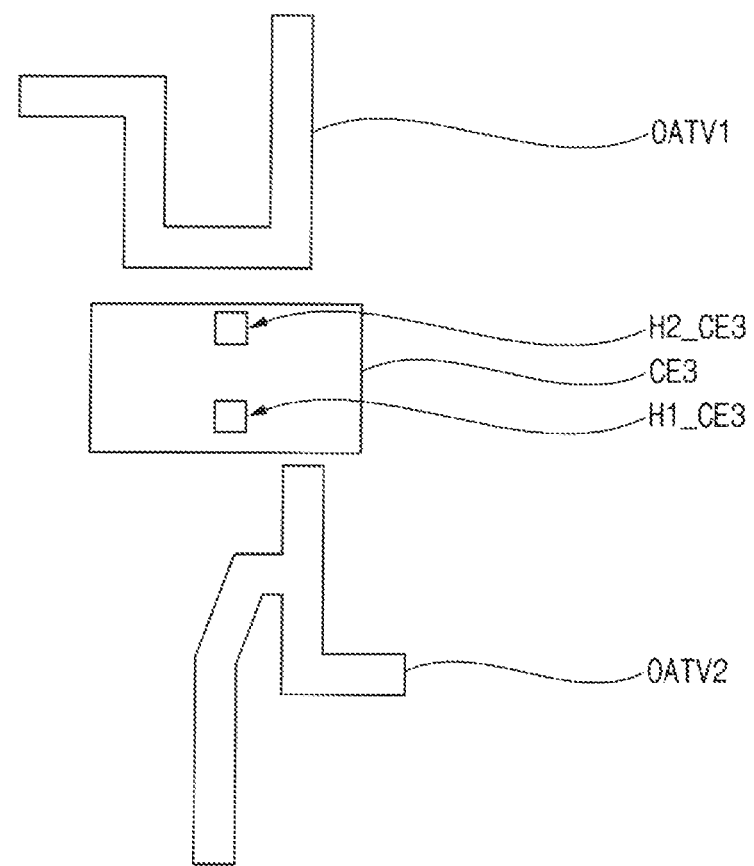
Figure 12:
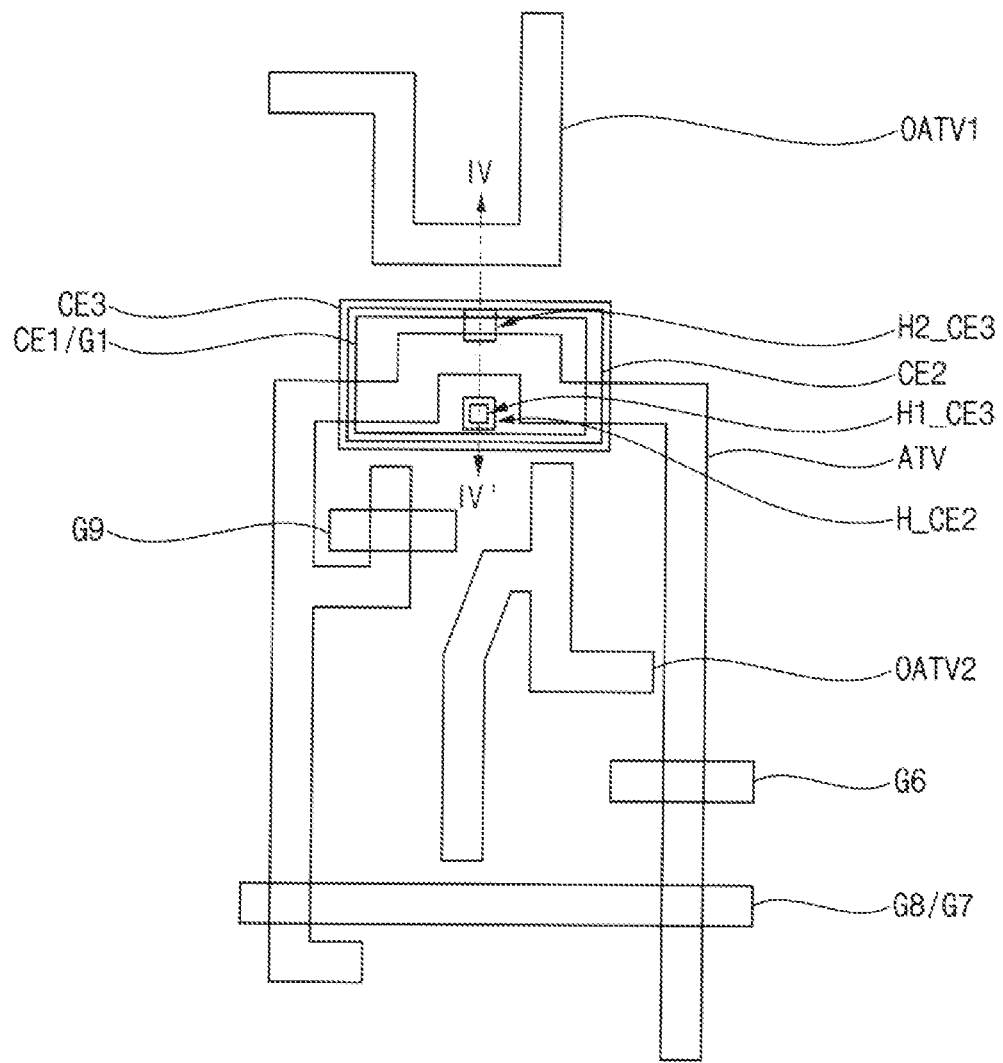
Figure 13:
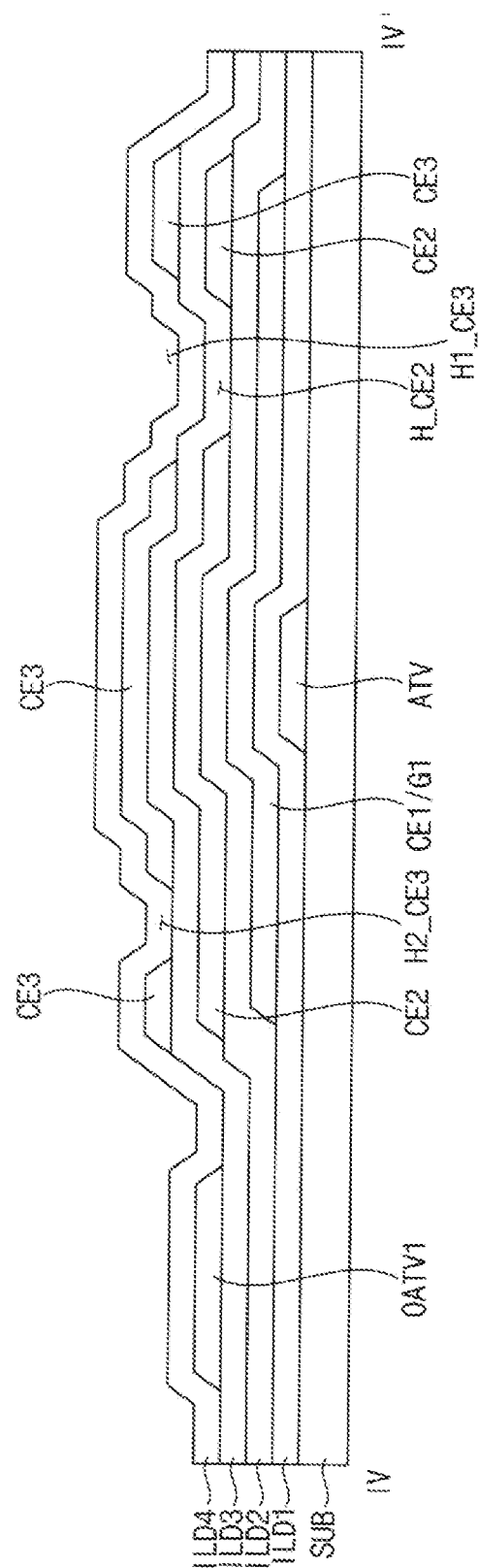

FIG. 11 is a plan view illustrating the second semiconductor layer OATV, FIG. 12 is a plan view illustrating the first semiconductor layer ATV, the first conductive layer CL1, the second capacitor electrode CE2, and the second semiconductor layer OATV, and FIG. 13 is a sectional view taken along line IV-IV' of FIG. 12.

Referring to FIG. 11, the second semiconductor layer OATV may include an oxide semiconductor. For example, the second semiconductor layer OATV may include indium gallium zinc oxide (IGZO).

The second semiconductor layer OATV may include a first oxide semiconductor pattern OATV1, a second oxide semiconductor pattern OATV2, and a third capacitor electrode CE3. Each of the first oxide semiconductor pattern OATV1, the second oxide semiconductor pattern OATV2, and the third capacitor electrode CE3 may include the oxide semiconductor.

The first oxide semiconductor pattern OATV1 may be spaced apart from the second oxide semiconductor pattern OATV2 in the second direction DR2. The third capacitor electrode CE3 may be disposed between the first oxide semiconductor pattern OATV1 and the second oxide semiconductor pattern OATV2 in a plan view. In this case, the third capacitor electrode CE3 may be spaced apart from each of the first oxide semiconductor pattern OATV1 and the second oxide semiconductor pattern OATV2.

The third capacitor electrode CE3 may include a second through hole H1_CE3 and a third through hole H2_CE3. Each of the second through hole H1_CE3 and the third through hole H2_CE3 may be formed through the third capacitor electrode CE3.

Referring to FIGS. 1, 2, 3, 12, and 13, after forming the second semiconductor layer OATV on the third insulating layer ILD3, a fourth insulating layer ILD4 may be formed on the third insulating layer ILD3.

The second semiconductor layer OATV may be formed by forming an oxide semiconductor material onto the entire surface of the third insulating layer ILD3 to form an oxide semiconductor layer, and then patterning the oxide semiconductor layer. For example, the oxide semiconductor layer may be patterned to form the first oxide semiconductor pattern OATV1, the second oxide semiconductor pattern OATV2, and the third capacitor electrode CE3.

The third capacitor electrode CE3 may overlap the second capacitor electrode CE2 to define the second capacitor CAP2. In this case, the second capacitor electrode CE2 may be referred to as a first electrode of the second capacitor CAP2, and the third capacitor electrode CE3 may be referred to as a second electrode of the second capacitor CAP2.

In the present disclosure, the third capacitor electrode CE3 may completely overlap the second capacitor electrode CE2 to define the second capacitor CAP2, and at the same time, the second capacitor electrode CE2 may overlap the first capacitor electrodes CE1/G1 to define the first capacitor CAP1. In other words, the first capacitor CAP1 and the second capacitor CAP2 may overlap each other while sharing the second capacitor electrode CE2 in a plan view. Accordingly, a first width W1 of each of the plurality of pixels PX may be relatively reduced, and the display device 1000 may display a high-resolution image.

The second through hole H1_CE3 may overlap the first through hole H_CE2 in a plan view. In other words, in a plan view, a portion of the upper surface of the first capacitor electrode CE1/G1 may be exposed through a through hole formed in the fourth insulating layer ILD4, the second through hole H1_CE3, and the first through hole H_CE2, and.

The third through hole H2_CE3 may overlap a portion of the second capacitor electrode CE2. The third through hole H2_CE3 may not overlap the first through hole H_CE2. In other words, in a plan view, a portion of the upper surface of the second capacitor electrode CE2 may be exposed through a through hole formed in the fourth insulating layer ILD4 and the third through hole H2_CE3.

The fourth insulating layer ILD4 may include an inorganic insulating material. For example, the fourth insulating layer ILD4 may include silicon oxide. Through holes may be formed in the fourth insulating layer ILD4 to exposed the upper surface of the first capacitor electrode CE1/G1 and the upper surface of the second capacitor electrode CE2.

Figure 14:
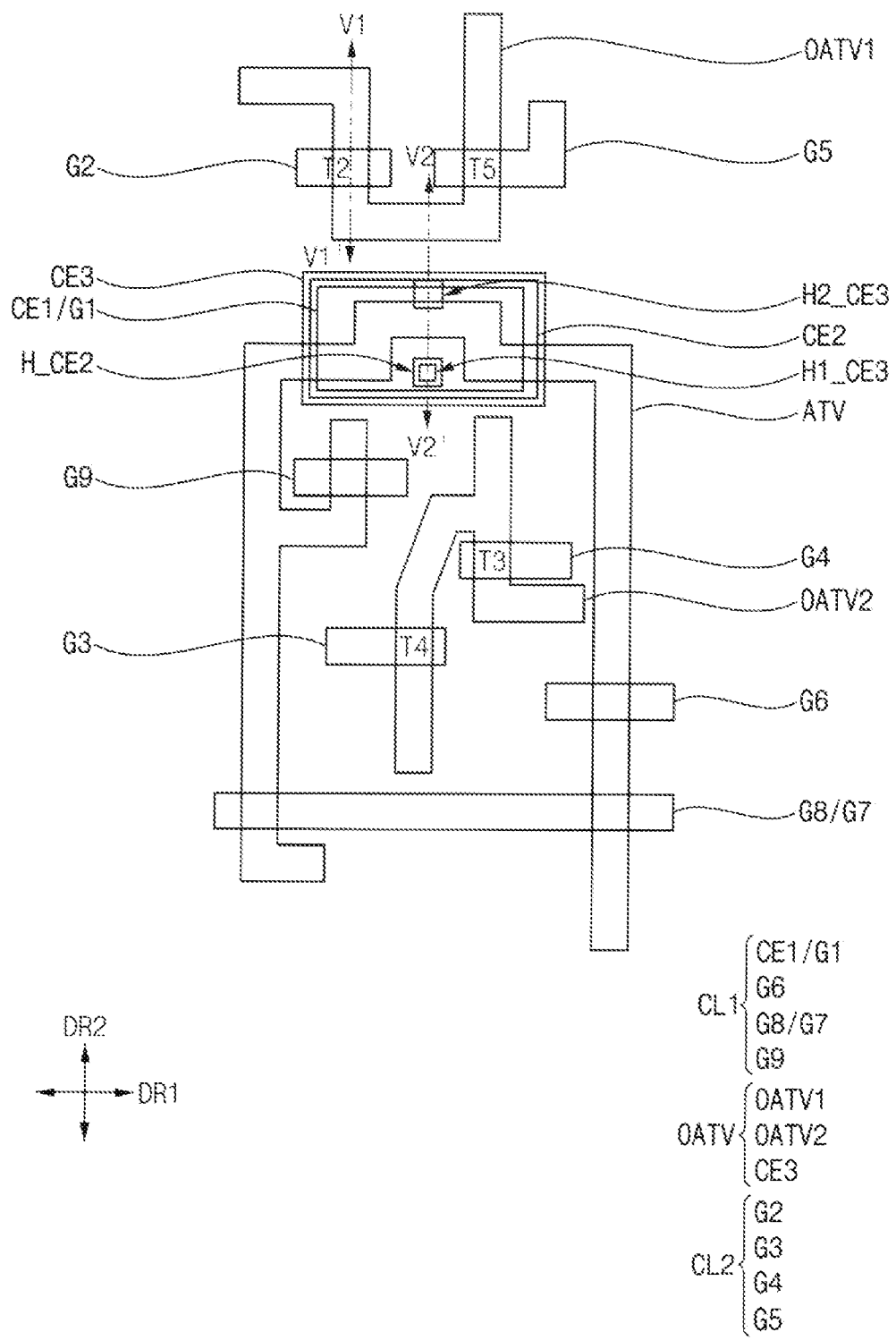
Figure 15:
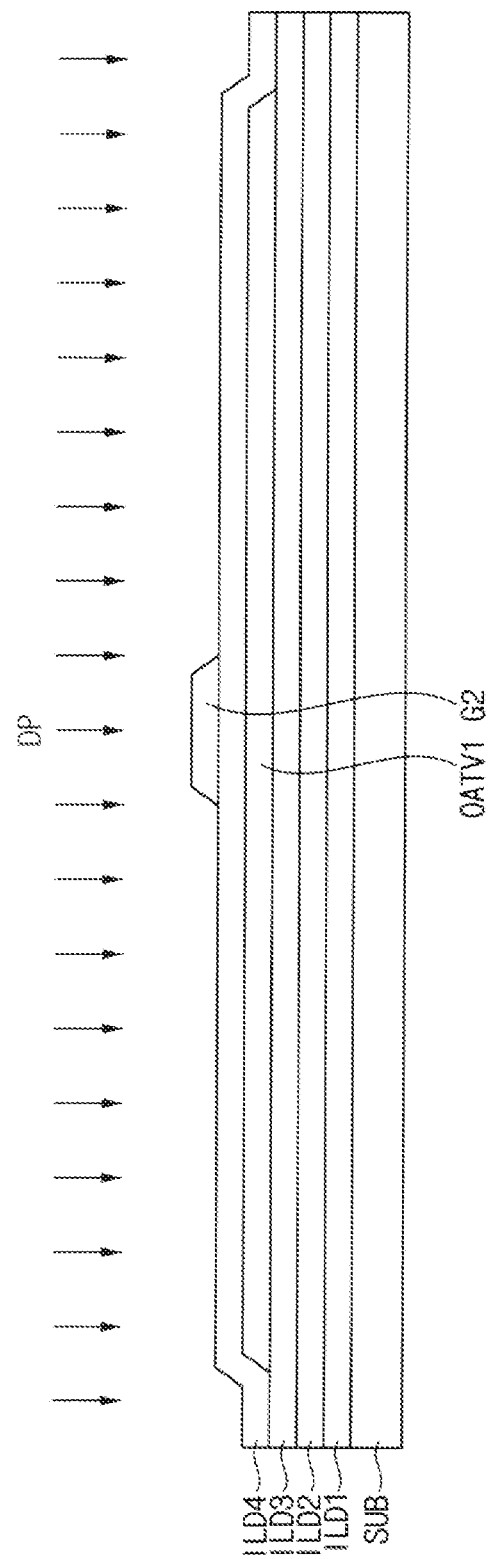
Figure 16:
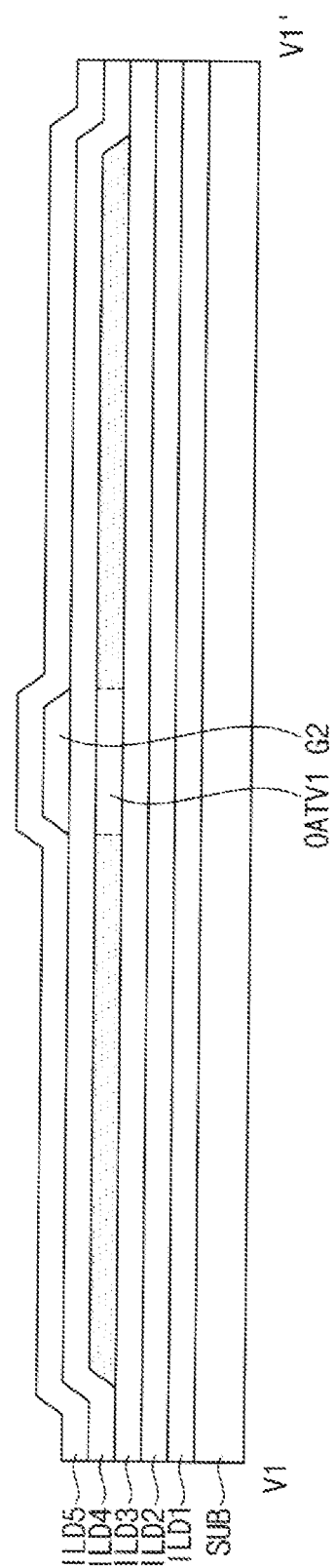
Figure 17:
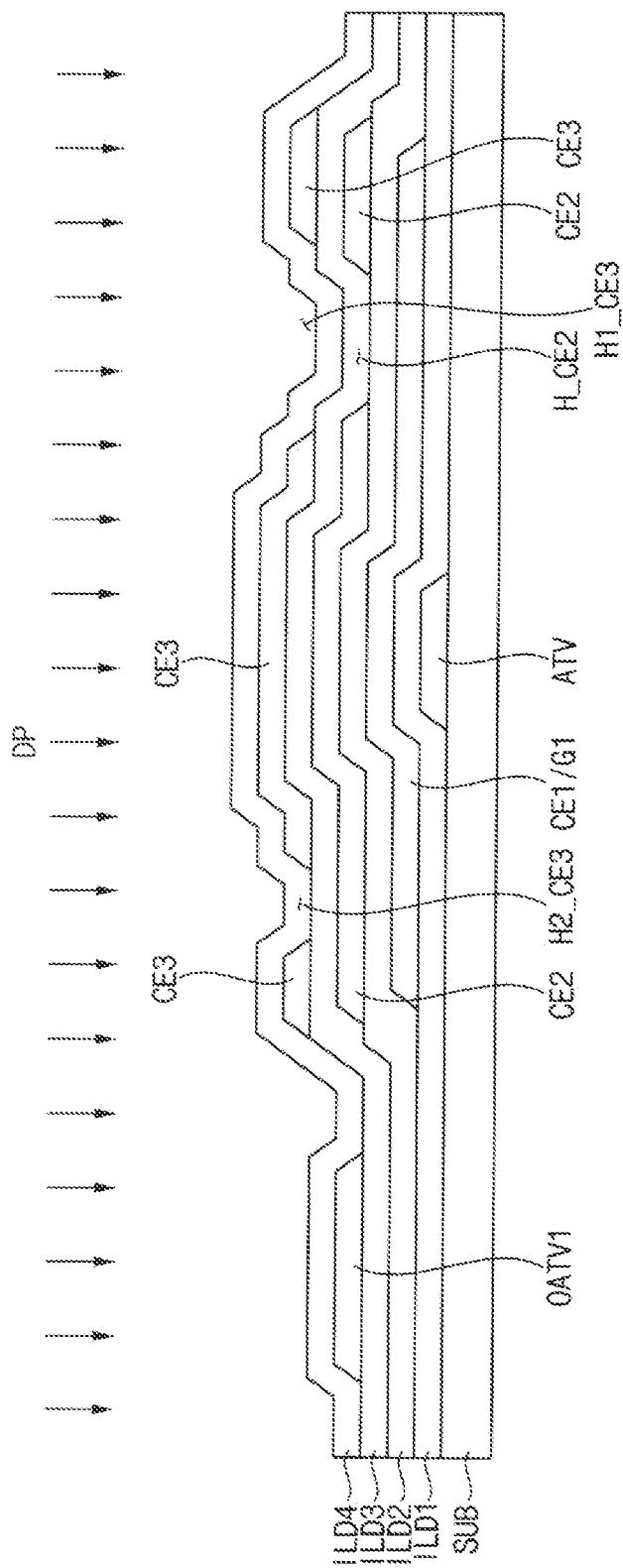
Figure 18:
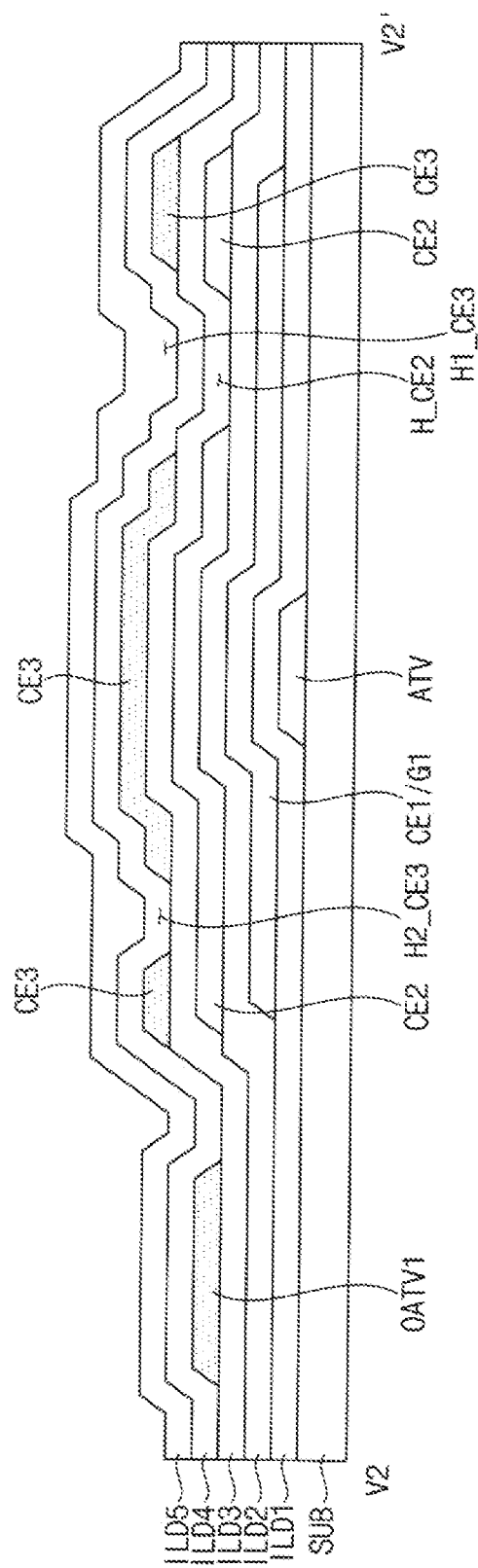

FIG. 14 is a plan view illustrating the first semiconductor layer ATV, the first conductive layer CL1, the second capacitor electrode CE2, the second semiconductor layer OATV, and the second conductive layer CL2, FIG. 15 is a sectional view for explaining a method of manufacturing a pixel according to an embodiment of the present disclosure, FIG. 16 is a sectional view taken along line V1-V1' of FIG. 14, FIG. 17 is a sectional view for explaining a method of manufacturing a pixel according to an embodiment of the present disclosure, and FIG. 18 is a sectional view taken along line V2-V2' of FIG. 14.

Referring to FIGS. 2, 3, 14, 16, and 18, after forming the second conductive layer CL2 on the fourth insulating layer ILD4, a fifth insulating layer ILD5 covering the second conductive layer CL2 may be formed on the fourth insulating layer ILD4.

The second conductive layer CL2 may be formed by forming a conductive material onto the entire surface of the fourth insulating layer ILD4 to form a conductive layer, and then patterning the conductive layer. For example, the conductive layer may be patterned to form a second gate electrode G2, a third gate electrode G3, a fourth gate electrode G4, and a fifth gate electrode G5.

At least a portion of the second conductive layer CL2 may overlap the second semiconductor layer OATV. For example, at least a portion of each of the second gate electrode G2 and the fifth gate electrode G5 may overlap the first oxide semiconductor pattern OATV1 to define the second transistor T2 and the fifth transistor T5. For example, at least a portion of each of the third gate electrode G3 and the fourth gate electrode G4 may overlap the second oxide semiconductor pattern OATV2 to define the third transistor T3 and the fourth transistor T4.

The fifth insulating layer ILD5 may include an inorganic insulating material. For example, the fifth insulating layer ILD5 may include silicon oxide.

Referring to FIGS. 15, 16, 17, and 18, according to one embodiment, after forming the second conductive layer CL2, impurities DP may be implanted into the second semiconductor layer OATV by using the second conductive layer CL2 as a mask. For example, the impurities DP may be implanted by using an ion implantation method. The impurities DP may include a material capable of increasing the electrical conductivity of the second semiconductor layer OATV. For example, the impurities DP may include boron.

Figure 19:
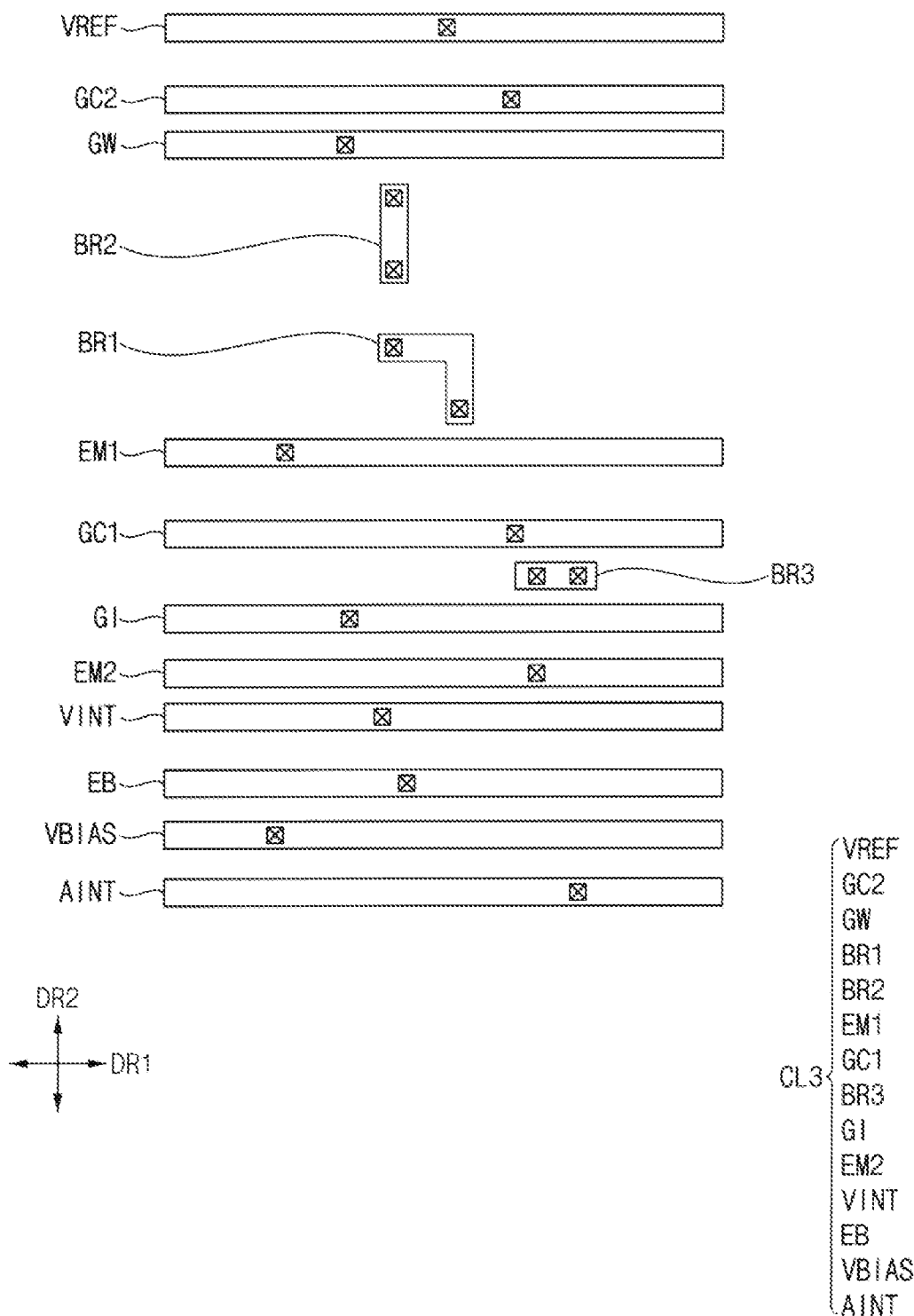
Figure 20:
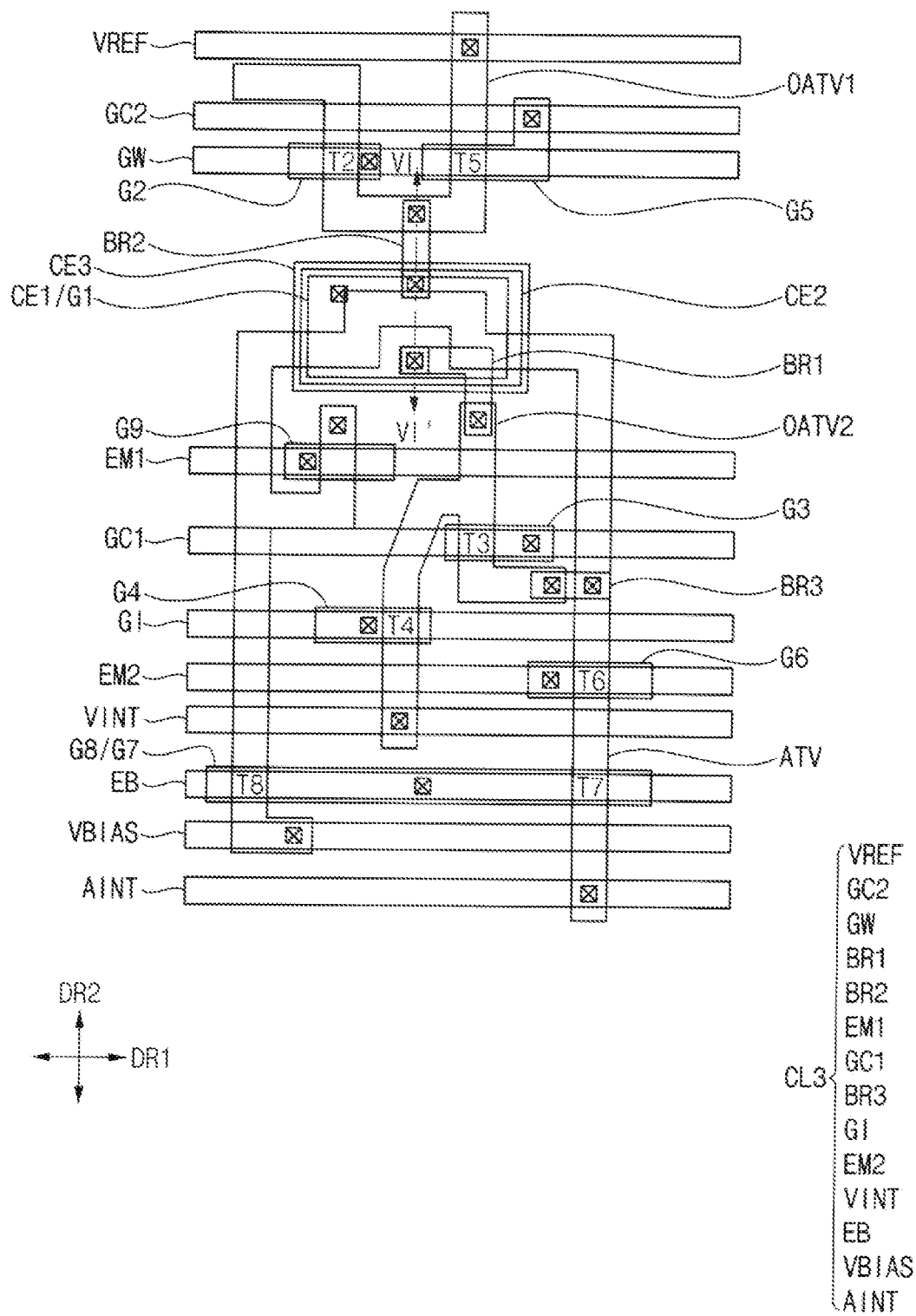
Figure 21:
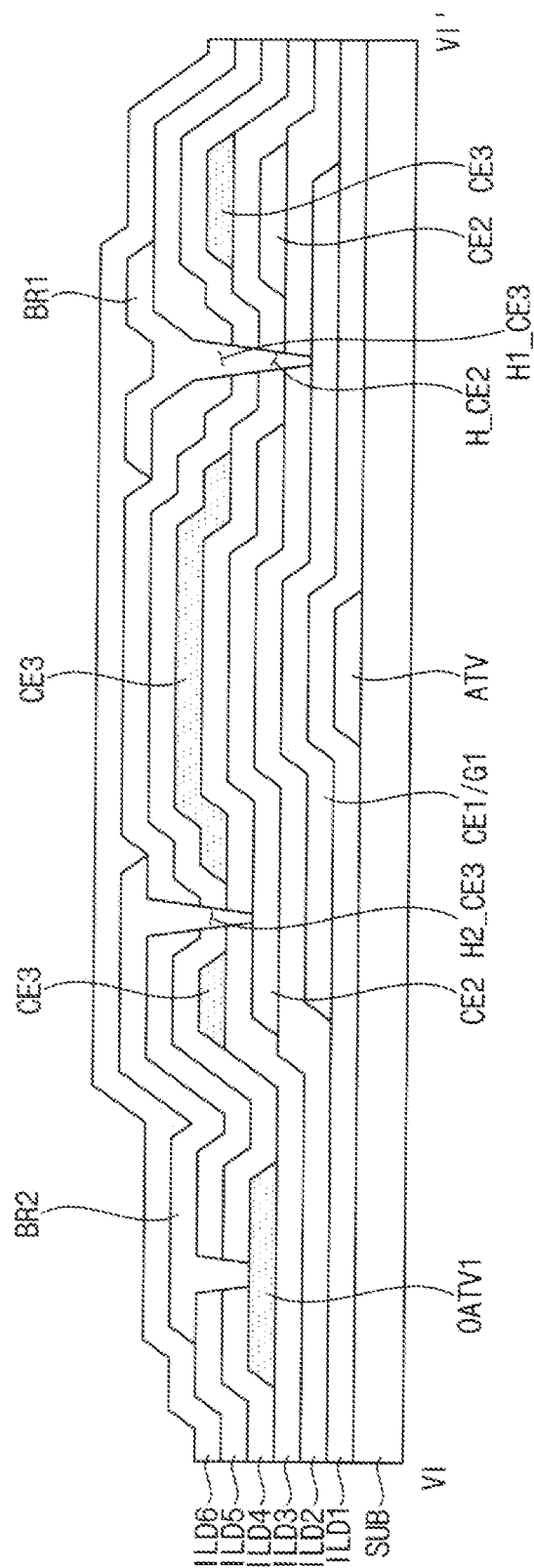

FIG. 19 is a plan view illustrating the third conductive layer CL3, FIG. 20 is a plan view illustrating the first semiconductor layer ATV, the first conductive layer CL1, the second capacitor electrode CE2, the second semiconductor layer OATV, the second conductive layer CL2, and the third conductive layer CL3, and FIG. 21 is a sectional view taken along the line VI-VI' of FIG. 20.

Referring to FIG. 19, the third conductive layer CL3 may include a reference voltage line VREF, a second compensation control line GC2, a scan line GW, a first emission control line EM1, a first compensation control line GC1, a first initialization control line GI, a second emission control line EM2, a first initialization voltage line VINT, a second initialization control line EB, a bias voltage line VBIAS, a second initialization voltage line AINT, a first bridge electrode BR1, a second bridge electrode BR2, and a third bridge electrode BR3.

Each of the reference voltage line VREF, second compensation control line GC2, scan line GW, first emission control line EM1, first compensation control line GC1, first initialization control line GI, second emission control line EM2, first initialization voltage line VINT, second initialization control line EB, bias voltage line VBIAS, and second initialization voltage line AINT may extend in the first direction DR1. In addition, the reference voltage line VREF, second compensation control line GC2, scan line GW, first emission control line EM1, first compensation control line GC1, first initialization control line GI, second emission control line EM2, first initialization voltage line VINT, second initialization control line EB, bias voltage line VBIAS, and second initialization voltage line AINT may be arranged in the second direction DR2.

Referring to FIGS. 2, 3, 20 and 21, after forming the third conductive layer CL3 on the fifth insulating layer ILD5, a sixth insulating layer ILD6 covering the third conductive layer CL3 may be formed on the fifth insulating layer ILD5.

The third conductive layer CL3 may be formed by forming a conductive material onto the entire surface of the fifth insulating layer ILD5 to form a conductive layer, and then patterning the conductive layer. For example, the reference voltage line VREF, second compensation control line GC2, scan line GW, first emission control line EM1, first compensation control line GC1, first initialization control line GI, second emission control line EM2, first initialization voltage line VINT, second initialization control line EB, bias voltage line VBIAS, second initialization voltage line AINT, first bridge electrode BR1, second bridge electrode BR2, and third bridge electrode BR3 may be formed by patterning the conductive layer.

The reference voltage line VREF may come into contact with the second semiconductor layer OATV. For example, the reference voltage line VREF may come into contact with the input terminal of the fifth transistor T5, so that the reference voltage line VREF may provide a reference voltage to the fifth transistor T5.

The second compensation control line GC2 may come into contact with the fifth gate electrode G5. Accordingly, the second compensation control line GC2 may provide a second compensation control signal to the gate electrode of the fifth transistor T5.

The scan line GW may come into contact with the second gate electrode G2. Accordingly, the scan line GW may provide a scan signal to the gate electrode of the second transistor T2.

The first emission control line EM1 may come into contact with the ninth gate electrode G9. Accordingly, the first emission control line EM1 may provide a first emission control signal to the gate electrode of the ninth transistor T9.

The first compensation control line GC1 may come into contact with the third gate electrode G3. Accordingly, the first compensation control line GC1 may provide a first compensation control signal to the gate electrode of the third transistor T3.

The first initialization control line GI may come into contact with the fourth gate electrode G4. Accordingly, the first initialization control line GI may provide a first initialization control signal to the gate electrode of the fourth transistor T4.

The second emission control line EM2 may come into contact with the sixth gate electrode G6. Accordingly, the second emission control line EM2 may provide a second emission control signal to the gate electrode of the sixth transistor T6.

The first initialization voltage line VINT may come into contact with the second semiconductor layer OATV. For example, the first initialization voltage line VINT may come into contact with the input terminal of the fourth transistor T4. Accordingly, the first initialization voltage line VINT may provide a first initialization voltage to the input terminal of the fourth transistor T4.

The second initialization control line EB may come into contact with the seventh gate electrode G7 and the eighth gate electrode G8. Accordingly, the second initialization control line EB may provide a second initialization control signal to the seventh gate electrode G7 and the eighth gate electrode G8.

The bias voltage line VBIAS may come into contact with the first semiconductor layer ATV. For example, the bias voltage line VBAIS may come into contact with the input terminal of the eighth transistor T8. Accordingly, the bias voltage line VBAIS may provide a bias voltage to the input terminal of the eighth transistor T8.

The second initialization voltage line AINT may come into contact with the first semiconductor layer ATV. For example, the second initialization voltage line AINT may come into contact with the input terminal of the seventh transistor T7. Accordingly, the second initialization voltage line AINT may provide a second initialization voltage to the input terminal of the seventh transistor T7.

According to the present disclosure, the first initialization voltage line VINT and the second initialization voltage line AINT may be spaced apart from each other. Accordingly, the first initialization voltage and the second initialization voltage may be separated from each other, and the display device 1000 may be driven at a high speed.

The first bridge electrode BR1 may come into contact with the second semiconductor layer OATV. For example, the first bridge electrode BR1 may come into contact with the output terminal of the third transistor T3 and the output terminal of the fourth transistor T4. At the same time, the first bridge electrode BR1 may come into contact with a portion of the upper surface of the first capacitor electrode CE1/G1 exposed through the first through hole H_CE2 and the second through hole H1_CE3.

The second bridge electrode BR2 may come into contact with the second semiconductor layer OATV. For example, the second bridge electrode BR2 may come into contact with the output terminal of the second transistor T2 and the output terminal of the fifth transistor T5. At the same time, the second bridge electrode BR2 may come into contact with a portion of the upper surface of the second capacitor electrode CE2 exposed through the third through hole H2_CE3.

The third bridge electrode BR3 may come into contact with the second semiconductor layer OATV. For example, the third bridge electrode BR3 may come into contact with the input terminal of the third transistor T3. At the same time, the third bridge electrode BR3 may come into contact with the first semiconductor layer ATV. For example, the third bridge electrode BR3 may come into contact with the output terminal of the first transistor T1 and the input terminal of the sixth transistor T6.

The sixth insulating layer ILD6 may include an inorganic insulating material. For example, the sixth insulating layer ILD6 may include silicon oxide.

Figure 22:
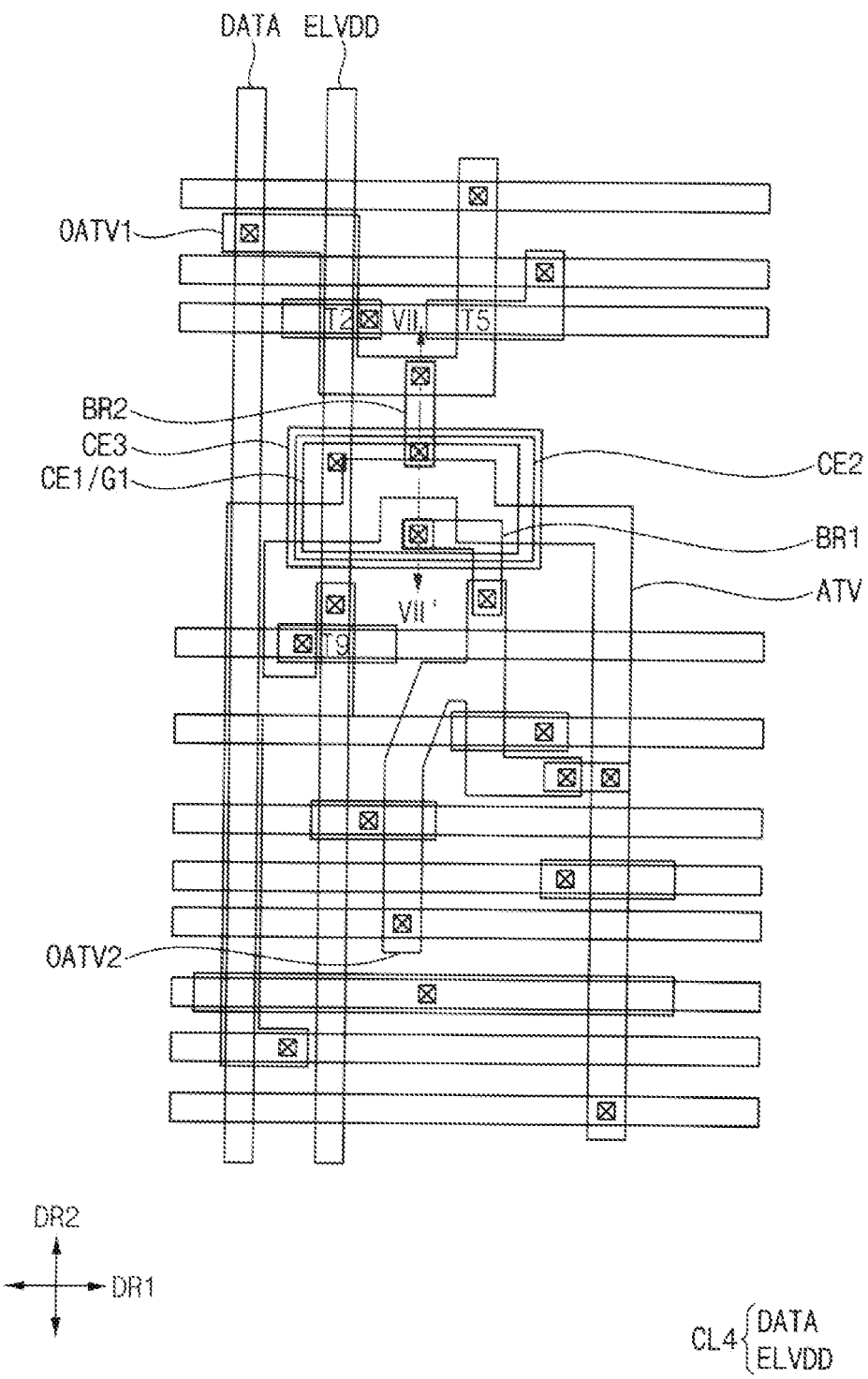
Figure 23:
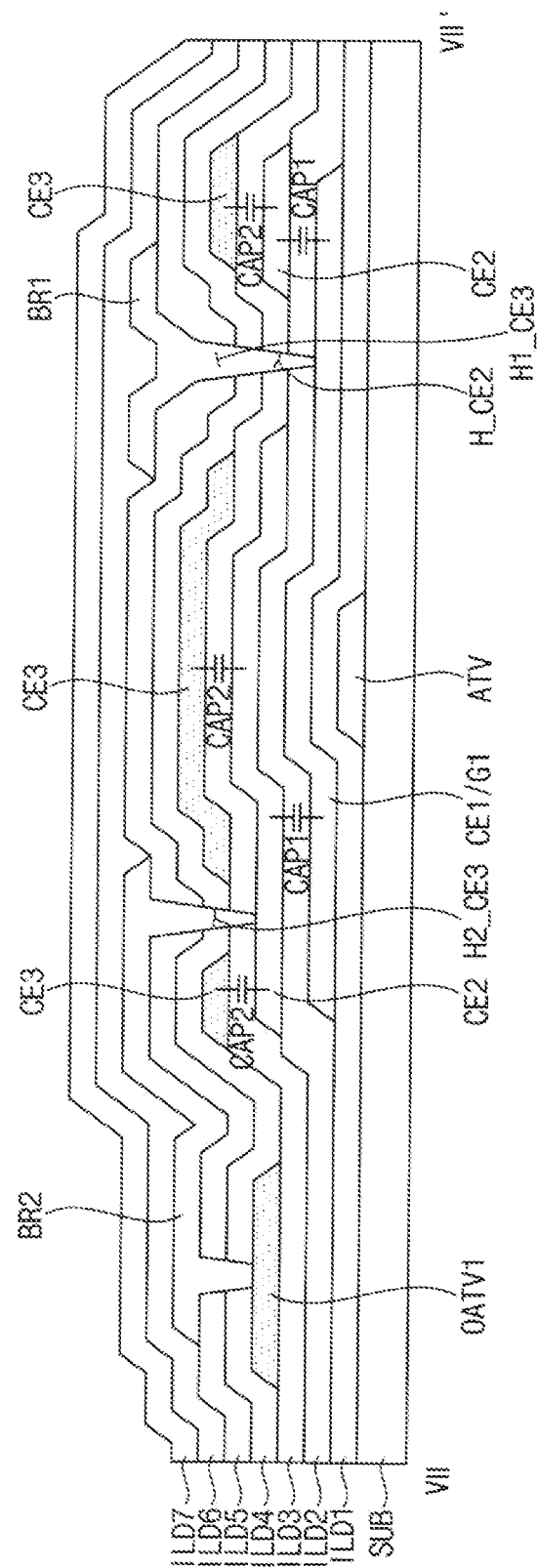

FIG. 22 is a plan view illustrating a first semiconductor layer ATV, a first conductive layer CL1, a second capacitor electrode CE2, a second semiconductor layer OATV, a second conductive layer CL2, a third conductive layer CL3, and a fourth conductive layer CL4, and FIG. 23 is a sectional view taken along line VII-VII' of FIG. 22.

Referring to FIGS. 2, 3, 22 and 23, after forming the fourth conductive layer CL4 on the sixth insulating layer ILD6, a seventh insulating layer ILD7 covering the fourth conductive layer CL4 may be formed on the sixth insulating layer ILD6. A.

The fourth conductive layer CL4 may be formed by forming a conductive material onto the entire surface of the sixth insulating layer ILD6 to form a conductive layer, and then patterning the conductive layer. For example, a data line DATA and a first power voltage line ELVDD may be formed by patterning the conductive layer.

The data line DATA may extend in the second direction DR2. The data line DATA may come into contact with the second semiconductor layer OATV. For example, the data line DATA may come into contact with the input terminal of the second transistor T2. Accordingly, the data line DATA may provide a data signal to the input terminal of the second transistor T2.

The first power voltage line ELVDD may extend in the second direction DR2. The first power voltage line ELVDD may be spaced apart from the data line DATA in the first direction DR1.

The first power voltage line ELVDD may come into contact with the third capacitor electrode CE3. Accordingly, the first power voltage line ELVDD may provide a first power voltage to the second electrode of the second capacitor CAP2.

The first power voltage line ELVDD may come into contact with the semiconductor layer ATV. For example, the first power voltage line ELVDD may come into contact with the input terminal of the ninth transistor T9. Accordingly, the first power voltage line ELVDD may provide a first power voltage to the input terminal of the ninth transistor T9.

The capacitance of the first capacitor CAP1 may be determined according to a first overlapping area, which is an overlapping area between the first capacitor electrodes CE1/G1 and the second capacitor electrode CE2 in a plan view, and the first permittivity of a material present between the capacitor electrodes CE1/G1 and the second capacitor electrode CE2. In addition, the capacitance of the second capacitor CAP2 may be determined according to a second overlapping area, which is an overlapping area between the second capacitor electrode CE2 and the third capacitor electrode CE3 in a plan view, and the second permittivity of a material present between the second capacitor electrodes CE2 and the third capacitor electrode CE3. In one embodiment, the area of the second capacitor electrode CE2 may be greater than the area of the first capacitor electrode CE1/G1 in a plan view. Accordingly, the capacitance of the second capacitor electrode CE2 may be adjusted to be increased or reduced by increasing or reducing the area of the third capacitor electrode CE3 in a plan view.

In one embodiment, the size of the first overlapping area may be substantially the same as the size of the second overlapping area in a plan view. In this case, an area of the second capacitor electrode CE2 may be less than an area the first capacitor electrode CE1/G1 and the third capacitor electrode CE3, or an area of the second capacitor electrode CE2 may be greater than areas of the first capacitor electrode CE1/G1 and the third capacitor electrode CE3, and an area of the first capacitor electrode CE1/G1 and an area of the third capacitor electrode CE3 may be the same. In this case, when the first permittivity and the second permittivity are substantially the same, the capacitance of the first capacitor CAP1 may be substantially the same as the capacitance of the second capacitor CAP2.

The seventh insulating layer ILD7 may include an inorganic insulating material. For example, the seventh insulating layer ILD7 may include silicon oxide.

Figure 24:
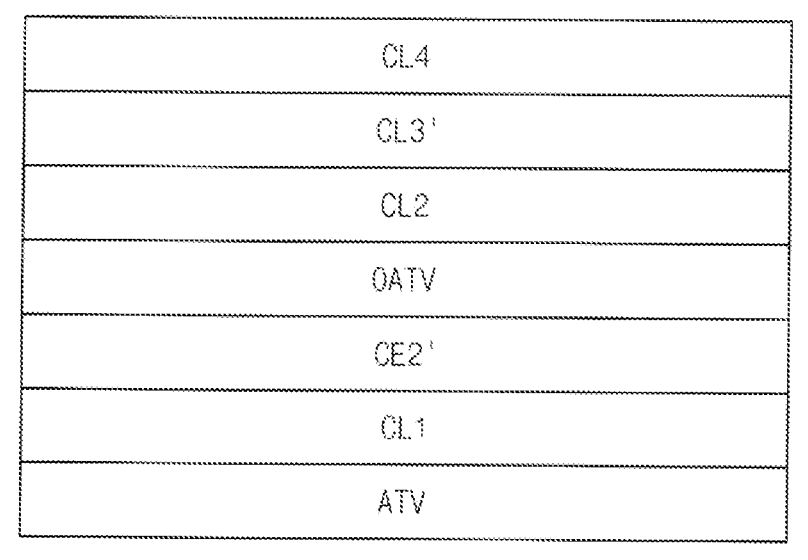

FIG. 24 is a view schematically illustrating a stack structure of components included in the pixel included in the display device of FIG. 1.

Referring to FIGS. 1, 2, and 24, each of the plurality of pixels PX may include a first semiconductor layer ATV, a first conductive layer CL1, a second capacitor electrode CE2', a second semiconductor layer OATV, a second conductive layer CL2, a third conductive layer CL3', and a fourth conductive layer CL4.

The first semiconductor layer ATV, the first conductive layer CL1, the second semiconductor layer OATV, the second conductive layer CL2, and the fourth conductive layer CL4 may be substantially the same as the first semiconductor layer ATV, the first conductive layer CL1, the second semiconductor layer OATV, the second conductive layer CL2, and the fourth conductive layer CL4, respectively, which are described with reference to FIGS. 3 to 23.

The second capacitor electrode CE2' may include a conductive material. For example, the second capacitor electrode CE2' may include a metal material. The second capacitor electrode CE2' may be disposed between the first conductive layer CL1 and the second semiconductor layer OATV.

The third conductive layer CL3' may include a conductive material. For example, the third conductive layer CL3' may include a metal material. The third conductive layer CL3' may be disposed between the second conductive layer CL2 and the fourth conductive layer CL4.

Hereinafter, a pixel and a method of manufacturing the same according to an embodiment of the present disclosure will be described with reference to FIGS. 1 to 3 and FIGS. 24 to 28.

FIGS. 25 to 28 are views for explaining a pixel according to another embodiment of the present disclosure.

Figure 25:
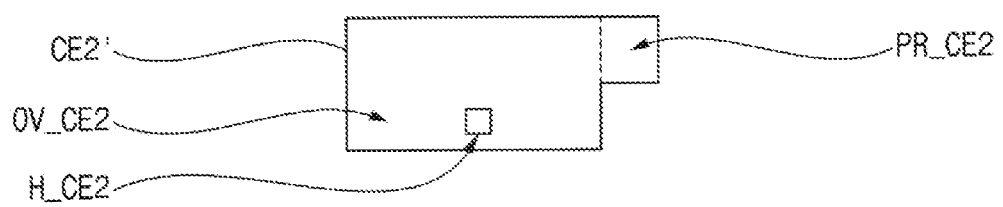
FIGS. 25, 26, 27 and 28 are views for explaining a pixel according to another embodiment of the present disclosure.
Figure 25:
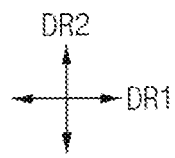

FIG. 25 is a plan view illustrating the second capacitor electrode CE2'.

Referring to FIG. 25, the second capacitor electrode CE2' may include an overlapping area OV_CE2 and a protruding area PR_CE2. The protruding area PR_CE2 may be disposed adjacent to the overlapping area OV_CE2. In one embodiment, the protruding area PR_CE2 may protrude from the overlapping area OV_CE2 in the first direction DR1.

The second capacitor electrode CE2' may include a first through hole H_CE2 in the overlapping area OV_CE2. The first through hole H_CE2 may be formed through the second capacitor electrode CE2'.

Figure 26:
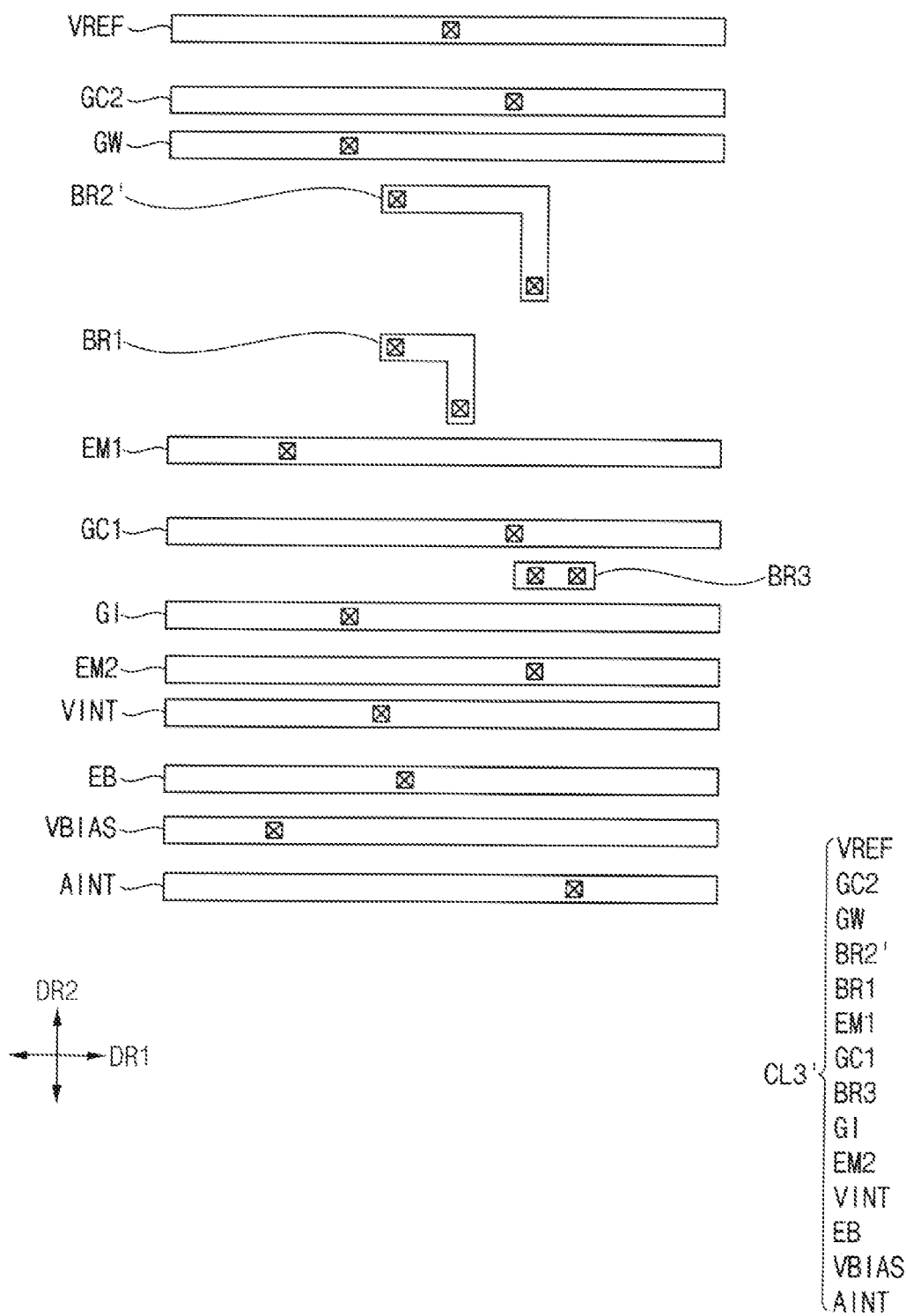

FIG. 26 is a plan view illustrating the third conductive layer CL3'.

Referring to FIG. 26, the third conductive layer CL3' may include a reference voltage line VREF, a second compensation control line GC2, a scan line GW, a first emission control line EM1, a first compensation control line GC1, a first initialization control line GI, a second emission control line EM2, a first initialization voltage line VINT, second initialization control line EB, a bias voltage line VBIAS, a second initialization voltage line AINT, a first bridge electrode BR1, a second bridge electrode BR2', and a third bridge electrode BR3.

The reference voltage line VREF, second compensation control line GC2, scan line GW, first emission control line EM1, first compensation control line GC1, first initialization control line GI, second emission control line EM2, first initialization voltage line VINT, second initialization control line EB, bias voltage line VBIAS, second initialization voltage line AINT, first bridge electrode BR1 and third bridge electrodes BR3 may be substantially the same as the reference voltage line VREF, second compensation control line GC2, scan line GW, first emission control line EM1, first compensation control line GC1, first initialization control line GI, second emission control line EM2, first initialization voltage line VINT, second initialization control line EB, bias voltage line VBIAS, second initialization voltage line AINT, first bridge electrode BR1, and the third bridge electrode BR3, respectively, which are described with reference to FIGS. 3 to 23.

Figure 27:
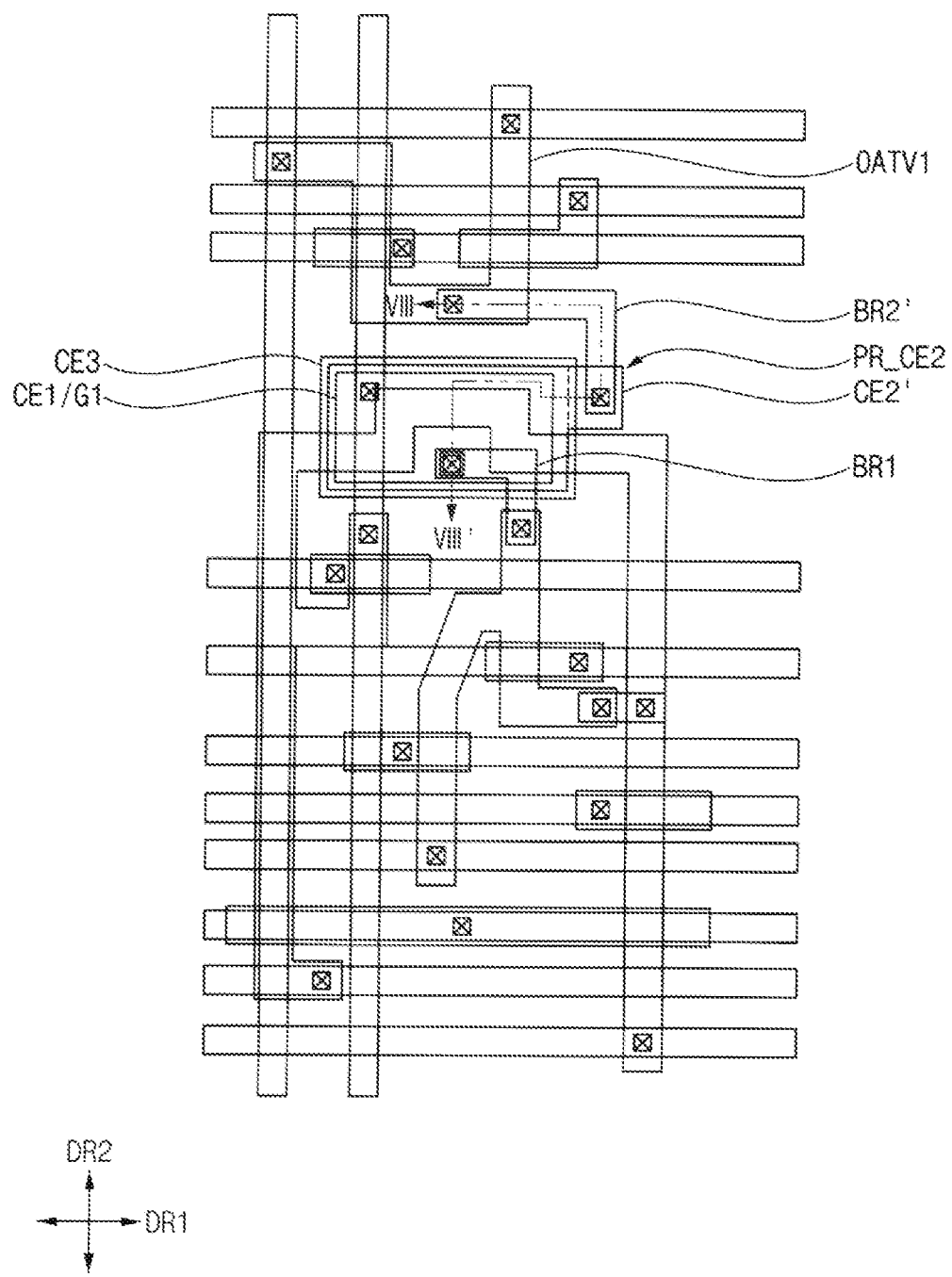
Figure 28:
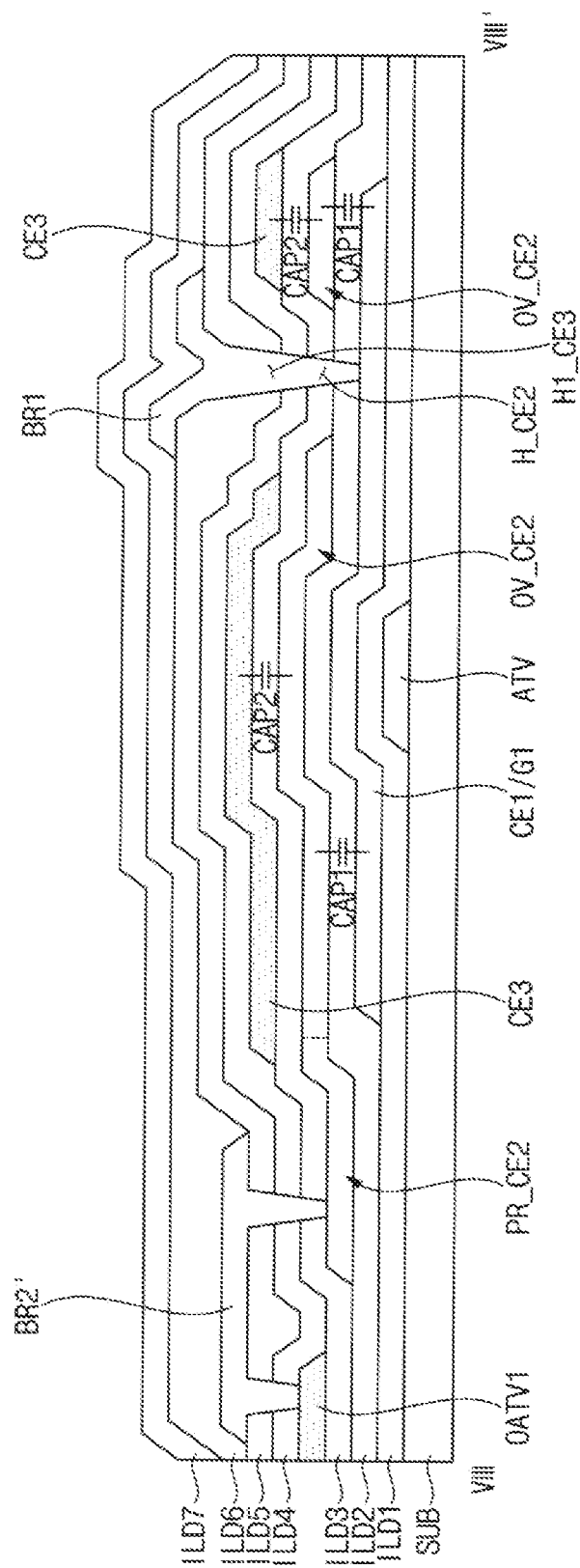

FIG. 27 is a plan view illustrating a first semiconductor layer ATV, a first conductive layer CL1, a second capacitor electrode CE2', a second semiconductor layer OATV, a second conductive layer CL2, a third conductive layer CL3', and a fourth conductive layer CL4, and FIG. 28 is a sectional view taken along the line VIII-VIII' of FIG. 27.

Referring to FIGS. 1 to 3 and FIGS. 27, and 28, the second bridge electrode BR2' may come into contact with the first oxide semiconductor pattern OATV1. For example, the second bridge electrode BR2' may come into contact with the output terminal of the second transistor T2 and the output terminal of the fifth transistor T5. In addition, the second bridge electrode BR2' may come into contact with the protruding area PR_CE2 of the second capacitor electrode CE2'. Accordingly, the first oxide semiconductor pattern OATV1 may be electrically connected to the second capacitor electrode CE2' by the second bridge electrode BR2', even if a through hole (for example, the third through hole H2_CE3 of FIGS. 11 to 23) is not formed in the third capacitor electrode CE3.

In this case, since the through hole (for example, the third through hole H2_CE3 of FIGS. 11 to 23) is not formed in the third capacitor electrode CE3, an overlapping area between the first capacitor electrode CE1/G of the second capacitor electrode CE2 may be relatively enlarged, so an overlapping area between the second capacitor electrode CE2 and the third capacitor electrode CE3 may be relatively enlarged. That is, the electric capacity of each of the first capacitor CAP1 and the second capacitor CAP2 may be relatively increased.

Although exemplary embodiments of the present inventive concept have been described above, it will be understood by those of ordinary skill in the art that various changes and modifications can be made to the present disclosure without departing from the idea and scope of the present inventive concept as disclosed in the appended claims.

The display device and the method of manufacturing the display device according to the embodiments of the present disclosure may be applied to a display device included in a computer, a smart phone, a smart pad, or the like, and a manufacturing process thereof.

What is claimed is:

1. A display device comprising:
   a first semiconductor layer;
   a first conductive layer disposed on the first semiconductor layer and including a first capacitor electrode at least partially overlapping the first semiconductor layer in a plan view to constitute a first transistor;
   a second capacitor electrode disposed on the first conductive layer and overlapping the first capacitor electrode in a plan view to constitute a first capacitor;
   a second semiconductor layer disposed on the second capacitor electrode and including a third capacitor electrode overlapping the second capacitor electrode in a plan view to constitute a second capacitor;
   a second conductive layer disposed on the second semiconductor layer and at least partially overlapping the second semiconductor layer; and
   a third conductive layer disposed on the second conductive layer.

2. The display device of claim 1, wherein the second capacitor electrode includes a first through hole exposing a portion of an upper surface of the first capacitor electrode, and the third capacitor electrode includes a second through hole overlapping the first through hole to expose the portion of the upper surface of the first capacitor electrode.

3. The display device of claim 2, wherein the third conductive layer includes a first bridge electrode connecting the upper surface of the first capacitor electrode exposed through the first through hole and the second through hole, and the second semiconductor layer.

4. The display device of claim 1, wherein the third capacitor electrode includes a third through hole exposing a portion of an upper surface of the second capacitor electrode.

5. The display device of claim 4, wherein the third conductive layer includes a second bridge electrode connecting the portion of the upper surface of the second capacitor electrode exposed through the third through hole, and the second semiconductor layer.

6. The display device of claim 1, wherein the second semiconductor layer and the second conductive layer constitute a second transistor, a third transistor, a fourth transistor, and a fifth transistor, and
   wherein the first semiconductor layer and the first conductive layer constitute a sixth transistor, a seventh transistor, an eighth transistor, and a ninth transistor.

7. The display device of claim 6, wherein the third conductive layer includes:
   a first initialization voltage line connected to an input terminal of the fourth transistor; and
   a second initialization voltage line connected to an input terminal of the seventh transistor while being spaced apart from the first initialization voltage line.

8. The display device of claim 1, wherein an area of the second capacitor electrode is larger than an area of the first capacitor electrode and the second capacitor electrode completely covers the first capacitor electrode in a plan view.

9. The display device of claim 8, wherein a size of a first overlapping area, which is an overlapping area between the first capacitor electrode and the second capacitor electrode in a plan view, is equal to a size of a second overlapping area, which is an overlapping area between the second capacitor electrode and the third capacitor electrode, in a plan view.

10. The display device of claim 1, wherein the second semiconductor layer includes an oxide semiconductor.

11. The display device of claim 10, wherein the second semiconductor layer includes a first oxide semiconductor pattern and a second oxide semiconductor pattern spaced apart from the first oxide semiconductor pattern.

12. The display device of claim 11, wherein the third capacitor electrode is disposed between the first oxide semiconductor pattern and the second oxide semiconductor pattern in a plan view.

13. A display device comprising:
    a first semiconductor layer;
    a first conductive layer disposed on the first semiconductor layer and including a first capacitor electrode at least partially overlapping the first semiconductor layer in a plan view to constitute a first transistor;
    a second capacitor electrode disposed on the first conductive layer and including an overlapping area overlapping the first capacitor electrode in a plan view to constitute a first capacitor, the second capacitor electrode including a protruding area protruding from the overlapping area;
    a second semiconductor layer disposed on the second capacitor electrode and including a third capacitor electrode overlapping the second capacitor electrode in a plan view to constitute a second capacitor, the third capacitor electrode exposing the protruding area in a plan view;
    a second conductive layer disposed on the second semiconductor layer and at least partially overlapping the second semiconductor layer; and a third conductive layer disposed on the second conductive layer.

14. The display device of claim 13, wherein the second semiconductor layer includes an oxide semiconductor.

15. The display device of claim 14, wherein the second semiconductor layer includes a first oxide semiconductor pattern spaced apart from the third capacitor electrode in a first direction.

16. The display device of claim 15, wherein the third conductive layer includes a first bridge electrode connected to the first oxide semiconductor pattern and the protruding area of the second capacitor electrode.

17. The display device of claim 15, wherein the protruding area of the second capacitor electrode protrudes from the overlapping area of the second capacitor electrode in a second direction perpendicular to the first direction.

* * * * *